US010679434B2

(12) United States Patent
Okude et al.

(10) Patent No.: US 10,679,434 B2
(45) Date of Patent: Jun. 9, 2020

(54) DEVICE DIAGNOSTIC APPARATUS, DEVICE DIAGNOSTIC SYSTEM AND DEVICE DIAGNOSTIC METHODS

(71) Applicant: HITACHI, LTD., Tokyo (JP)

(72) Inventors: Mariko Okude, Tokyo (JP); Takehisa Nishida, Tokyo (JP); Masayoshi Ishikawa, Tokyo (JP); Kazuo Muto, Tokyo (JP); Atsushi Katou, Tokyo (JP)

(73) Assignee: HITACHI, LTD., Tokyo (JP)

( * ) Notice: Subject to any disclaimer, the term of this patent is extended or adjusted under 35 U.S.C. 154(b) by 37 days.

(21) Appl. No.: 15/813,898

(22) Filed: Nov. 15, 2017

(65) Prior Publication Data

US 2018/0158257 A1  Jun. 7, 2018

(30) Foreign Application Priority Data

Dec. 5, 2016 (JP) ................................. 2016-235782

(51) Int. Cl.
*G07C 5/08* (2006.01)
*G05B 23/02* (2006.01)
*G06F 30/15* (2020.01)
*B60W 50/00* (2006.01)

(52) U.S. Cl.
CPC ....... *G07C 5/0808* (2013.01); *G05B 23/0243* (2013.01); *G06F 30/15* (2020.01); *B60W 2050/0088* (2013.01)

(58) Field of Classification Search
CPC .............. G07C 5/0808; G05B 23/0243; G06F 17/5095; B60W 2050/0088
See application file for complete search history.

(56) References Cited

U.S. PATENT DOCUMENTS

| 6,481,388 | B1* | 11/2002 | Yamamoto | F01P 7/044 123/41.1 |
|---|---|---|---|---|
| 2007/0028219 | A1* | 2/2007 | Miller | G05B 23/021 717/124 |
| 2012/0321173 | A1* | 12/2012 | Mitarai | G01B 11/03 382/154 |
| 2014/0318103 | A1 | 10/2014 | Latrofa et al. | |
| 2015/0268072 | A1 | 9/2015 | Fujiwara et al. | |
| 2016/0133070 | A1* | 5/2016 | Ikeda | G07C 5/008 701/31.4 |

FOREIGN PATENT DOCUMENTS

DE 102014217925 A1 3/2016
JP 2009-053938 A 3/2009

OTHER PUBLICATIONS

Extended European Search Report dated May 4, 2018 for the European Patent Application No. 17199989.9.
Communication pursuant to Article 94(3) EPC dated Jun. 5, 2019 for the European Patent Application No. 17199989.9.

* cited by examiner

*Primary Examiner* — Yuen Wong
(74) *Attorney, Agent, or Firm* — Volpe and Koenig, P.C.

(57) ABSTRACT

A device diagnostic apparatus according to the present invention includes: a diagnosis model selecting unit that selects a diagnosis model for diagnosing a moving device in accordance with a driving environment of the device; and a diagnosis unit that inputs operation data of the device to the selected diagnosis model, receives an output of a diagnosis result for the device from the diagnosis model, and diagnoses the device.

12 Claims, 16 Drawing Sheets

FIG. 7

| VEHICLE ID | POSITION | TIME POINT | OPERATION DATA | | | DRIVING ENVIRONMENT | | | |
|---|---|---|---|---|---|---|---|---|---|
| | | | COOLANT TEMPERATURE (°C) | COOLANT FLOW RATE (cc/MINUTE) | FAN ROTATION SPEED (RPM) | ROAD GRADIENT (DEGREE) | TRAFFIC VOLUME (VEHICLES/ MINUTE) | TEMPERATURE (°C) | HUMIDITY (%) |
| V001 | (X1,Y1) | 20161001 6:30:00 | 50 | 2000 | 1000 | 0 | 3 | 12 | 40 |
| V001 | (X2,Y2) | 20161001 6:31:00 | 50 | 2000 | 1000 | 0 | 2 | 12 | 40 |
| V001 | (X3,Y3) | 20161001 6:32:00 | 51 | 2100 | 1000 | 0 | 3 | 13 | 39 |
| .. | | | | | | | | | |
| V002 | (X4,Y4) | 20161001 13:40:00 | 70 | 3000 | 1500 | 5 | 14 | 20 | 100 |
| V002 | (X5,Y5) | 20161001 13:41:00 | 71 | 3100 | 1500 | 5 | 15 | 21 | 100 |
| V002 | (X6,Y6) | 20161001 13:42:00 | 70 | 3000 | 1500 | 5 | 14 | 20 | 100 |
| .. | | | | | | | | | |

FIG. 8

| DRIVING ENVIRONMENT ID | DRIVING ENVIRONMENT | | | | STATISTICAL MODEL ID | PHYSICAL MODEL ID | RECOMMENDED MODEL ID |
|---|---|---|---|---|---|---|---|
| | ROAD GRADIENT (DEGREE) | TRAFFIC VOLUME (VEHICLES/MINUTE) | TEMPERATURE (°C) | HUMIDITY (%) | | | |
| RC01 | NEGATIVE (DOWNHILL) | LESS THAN 10 | LESS THAN 20 | LESS THAN 60 | SM01 | MM01 | SM01 |
| RC02 | NEGATIVE (DOWNHILL) | LESS THAN 10 | LESS THAN 20 | 60 OR MORE | SM02 | MM01 | SM02 |
| RC03 | NEGATIVE (DOWNHILL) | LESS THAN 10 | 20 OR MORE | LESS THAN 60 | SM03 | MM01 | SM03 |
| RC04 | NEGATIVE (DOWNHILL) | LESS THAN 10 | 20 OR MORE | 60 OR MORE | SM04 | MM01 | SM04 |
| RC05 | NEGATIVE (DOWNHILL) | 10 OR MORE | LESS THAN 20 | LESS THAN 60 | SM05 | MM01 | SM05 |
| RC06 | NEGATIVE (DOWNHILL) | 10 OR MORE | LESS THAN 20 | 60 OR MORE | NONE (NOT LEARNED) | MM01 | MM01 |
| RC07 | NEGATIVE (DOWNHILL) | 10 OR MORE | 20 OR MORE | LESS THAN 60 | SM07 | MM01 | SM07 |
| RC08 | NEGATIVE (DOWNHILL) | 10 OR MORE | 20 OR MORE | 60 OR MORE | SM08 | MM01 | SM08 |
| RC09 | POSITIVE (UPHILL) | LESS THAN 10 | LESS THAN 20 | LESS THAN 60 | SM09 | MM02 | SM09 |
| RC10 | POSITIVE (UPHILL) | LESS THAN 10 | LESS THAN 20 | 60 OR MORE | SM10 | MM02 | SM10 |
| RC11 | POSITIVE (UPHILL) | LESS THAN 10 | 20 OR MORE | LESS THAN 60 | SM11 | MM02 | SM11 |
| RC12 | POSITIVE (UPHILL) | LESS THAN 10 | 20 OR MORE | 60 OR MORE | NONE (NOT LEARNED) | MM02 | MM02 |
| RC13 | POSITIVE (UPHILL) | 10 OR MORE | LESS THAN 20 | LESS THAN 60 | SM13 | MM02 | SM13 |
| RC14 | POSITIVE (UPHILL) | 10 OR MORE | LESS THAN 20 | 60 OR MORE | SM14 | MM02 | SM14 |
| RC15 | POSITIVE (UPHILL) | 10 OR MORE | 20 OR MORE | LESS THAN 60 | SM15 | MM02 | SM15 |
| RC16 | POSITIVE (UPHILL) | 10 OR MORE | 20 OR MORE | 60 OR MORE | SM16 | MM02 | SM16 |

FIG. 9

| VEHICLE ID 121 | POSITION 122 | TIME POINT 123 | OPERATION DATA 124 | DRIVING ENVIRONMENT ID 125 | USED DIAGNOSIS MODEL ID 126 | MODEL DIAGNOSIS RESULT 127 | MAINTENANCE WORKER DIAGNOSIS RESULT 128 | MODEL EVALUATION 129 |
|---|---|---|---|---|---|---|---|---|
| V001 | (X11,Y11) | 20161020 8:30:00 | (#,#,#) | RC01 | SM01 | NORMAL | NORMAL | ○ |
| V001 | (X12,Y12) | 20161020 8:31:00 | (#,#,#) | RC01 | SM01 | NORMAL | NORMAL | ○ |
| V001 | (X13,Y13) | 20161020 8:32:00 | (#,#,#) | RC01 | SM01 | ABNORMAL | NORMAL | × |
| V001 | (X14,Y14) | 20161020 8:33:00 | (#,#,#) | RC02 | SM02 | NORMAL | NORMAL | ○ |
| V001 | (X15,Y15) | 20161020 8:34:00 | (#,#,#) | RC02 | SM02 | NORMAL | ABNORMAL | ○ |
| V001 | (X16,Y16) | 20161020 8:35:00 | (#,#,#) | RC02 | SM02 | ABNORMAL | NORMAL | × |
| V001 | (X17,Y17) | 20161020 8:36:00 | (#,#,#) | RC06 | MM01 | ABNORMAL | NORMAL | × |
| V001 | (X18,Y18) | 20161020 8:37:00 | (#,#,#) | RC06 | MM01 | NORMAL | NORMAL | ○ |
| V001 | (X19,Y19) | 20161020 8:38:00 | (#,#,#) | RC14 | SM14 | NORMAL | NORMAL | ○ |
| V001 | (X20,Y20) | 20161020 8:39:00 | (#,#,#) | RC14 | SM14 | ABNORMAL | ABNORMAL | ○ |
| V001 | (X21,Y21) | 20161020 8:40:00 | (#,#,#) | RC14 | SM14 | ABNORMAL | ABNORMAL | ○ |
| V001 | (X22,Y22) | 20161020 8:41:00 | (#,#,#) | RC14 | SM14 | NORMAL | ABNORMAL | ○ |
| V001 | (X23,Y23) | 20161020 8:42:00 | (#,#,#) | RC10 | SM10 | NORMAL | NORMAL | ○ |
| V001 | (X24,Y24) | 20161020 8:43:00 | (#,#,#) | RC10 | SM10 | NORMAL | NORMAL | ○ |
| ... | | | | | | | | |

33

DEVICE DIAGNOSTIC APPARATUS, DEVICE DIAGNOSTIC SYSTEM AND DEVICE DIAGNOSTIC METHODS

BACKGROUND OF THE INVENTION

1. Field of the Invention

The present invention relates to a device diagnostic apparatus, a device diagnostic system, and a device diagnostic method.

2. Description of the Related Art

Techniques of diagnosing various sensor values acquired from devices being driven, predicting device failure, and preventing a serious failure in advance are generally in widespread use. In those techniques, various diagnosis models for determining the presence or absence of an abnormality of device are used. In a facility diagnosis system disclosed in JP 2009-53938 A, three models, that is, a physical model, a statistical model, and a knowledge model are used as a diagnosis model. Then, in the facility diagnosis system of JP 2009-53938 A, when a certain diagnosis model is updated, a diagnosis rule which is insufficient in the diagnosis model is compensated from other diagnosis models, and thus the overall reliability of the diagnosis model is improved.

Among the diagnosis model of the facility diagnosis system disclosed in JP 2009-53938 A, the reliability of the statistical model and the knowledge model is gradually improved by performing machine learning using a large number of learning data accumulated in the past. Therefore, when learning data of a device of a diagnosis target is not obtained easily, the reliability of the models first decreases each time a part is exchanged or a device configuration is changed, and it takes a lot of time until it is recovered. Further, the facility diagnosis system disclosed in JP 2009-53938 A is intended for fixed facilities such as facilities of buildings or industrial plants. In other words, in the diagnosis model generated by combining a plurality of diagnosis models by the facility diagnosis system disclosed in JP 2009-53938 A, there is no assumption that a driving environment of a device changes.

An example of a device on a side opposite to such a fixed facility is a vehicle such as an automobile. Examples of a driving environment of the automobile include a road shape, a road gradient, a road surface condition, and a weather. The driving environments change momentarily as the automobile travels. For example, a cooling device (radiator) of the automobile may be a diagnosis target. The automobile is assumed to go through a tunnel. A climate of an area before it enters tunnel is mild, a temperature is high, and humidity is low. On the other hand, an area after it leaves the tunnel is a snow country, a temperature is extremely low, and humidity is high.

The automobile accumulates a certain amount of learning data before entering the tunnel. However, the learning data is of little use after leaving the tunnel. A diagnosis model which has undergone machine learning using learning data repeatedly outputs a diagnosis result indicating "a cooling device is abnormal" at a moment at which it leaves the tunnel, and thus the reliability of diagnosis is lowered. In this regard, it is an object of the present invention to provide a technique capable of diagnosing devices whose driving environment changes momentarily with a high degree of reliability.

SUMMARY OF THE INVENTION

A device diagnostic apparatus according to the present invention includes: a diagnosis model selecting unit that selects a diagnosis model for diagnosing a moving device in accordance with a driving environment of the device; and a diagnosis unit that inputs operation data of the device to the selected diagnosis model, receives an output of a diagnosis result for the device from the diagnosis model, and diagnoses the device.

The other devices will be described in embodiments for carrying out the invention.

According to the present invention, it is possible to diagnose devices whose driving environment changes momentarily with a high degree of reliability.

BRIEF DESCRIPTION OF THE DRAWINGS

FIG. 7 is a diagram for describing operation/environment information;
FIG. 8 is a diagram for describing diagnosis model allocation information;
FIG. 9 is a diagram for describing diagnosis result information.

DESCRIPTION OF THE PREFERRED EMBODIMENTS

Figure 1:
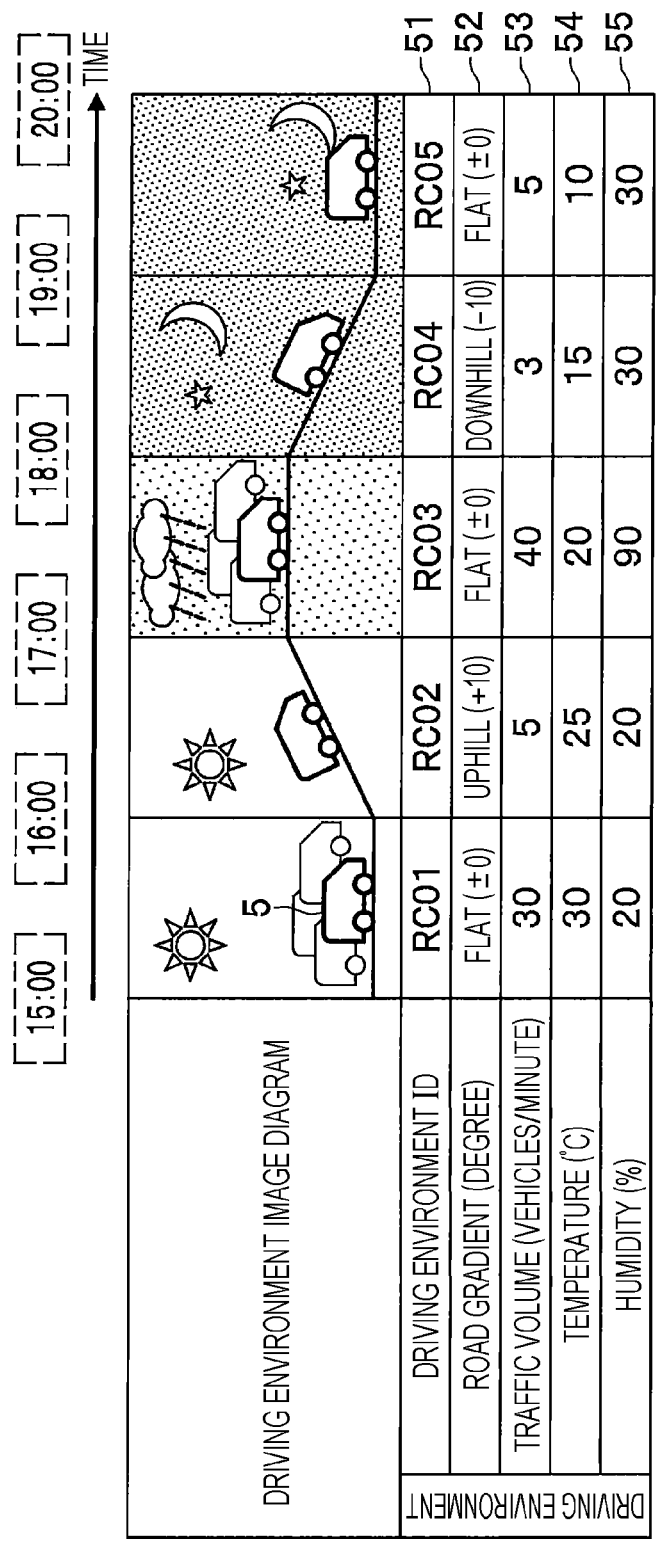
FIG. 1 is a diagram for describing a driving environment.

Hereinafter, a mode for carrying out the present invention (referred to as a "present embodiment") will be described in detail with reference to the accompanying drawings and the like. Specifically, the description will proceed with an example of diagnosing whether or not devices (a braking system, a power system, a steering system, a cooling system, and the like) of an automobile traveling on a road are normal. The present invention can also be applied to vehicles other than automobiles such as motorcycles, large-sized buses, railway vehicles, aircrafts, and the like. Furthermore, the present invention can also be applied to devices which human beings do not board. In the present embodiment, a term "vehicle" indicates a "moving device."

(Terminology)

"Operation data" indicates an arbitrary physical quantity for each device of the vehicle which can be obtained from the vehicle being driven. In many cases, the operation data indicates a sensor value (a measured value) acquired by an in-vehicle sensor. In addition to primary data acquired by a sensor, secondary data calculated as a result of processing and calculating the primary data is included in the operation data as well. As an example of the operation data, there are many types of data such as a vehicle speed, an engine rotation speed, a braking time, a cooling water temperature, a fan rotation speed, and a cooling water flow rate.

A driving environment is an arbitrary physical quantity for an external environment in which the vehicle travels. The driving environment may be acquired by an in-vehicle sensor or may be acquired by a sensor other than the in-vehicle sensor. The driving environment is divided into two, that is, the weather and a road attribute. Examples of the weather include a temperature, humidity, atmospheric pressure, a wind direction, a wind speed, and a precipitation amount. Examples of the road attributes include a gradient, an altitude, a traffic volume, the number of intersections, the number of lanes, a width, a road surface state, and a road shape (a tunnel or a bridge).

Data which is diagnosed by the device diagnostic apparatus of the present embodiment is the operation data. The device diagnostic apparatus inputs values of a plurality of types of operation data such as the cooling water temperature and the cooling water flow rate into a diagnosis model (to be detailed later) and acquires information indicating "normal" or "abnormal" as an output result from the diagnosis model. The diagnosis model receives the operation data and outputs a diagnosis result. In the present embodiment, a statistical model and a physical model are used as a type of diagnosis model.

The diagnosis model indicates a set of formulas (an equation, an inequality, and a conditional expressions) specifying a quantitative relation of an input variable, an output variable, and a parameter. The parameter is, for example, a coefficient by which the input variable is multiplied. The parameter is a constant and re different from the input variable and the output variable in that sense. However, a value of the parameter changes independently of the input variable and the output variable. It will be appreciated that a position and a shape of the diagnosis model within a coordinate space change as the value of parameter changes. Even through the value of the input variable is the same, if the value of the parameter is different, the value of the output variable is different. In the present embodiment, it is assumed that, if the driving environment changes, the value of the parameter changes, and the diagnosis result (normal/abnormal) also changes.

The statistical model is a model in which the operation data of the diagnosis target is applied to a set of operation data (learning data) actually acquired when it is known whether the device is normal or abnormal. It is assumed that, when a device which is known to be normal in a certain driving state is continuously driven for 60 minutes, three sensors acquire the operation data as learning data with a one-minute cycle. In this case, 60 pieces of three-dimensional operation data are acquired chronologically. Further, the operation data serves as the learning data or the diagnosis target depending on a role thereof.

If points indicating the 60 pieces of operation data are dotted in a three-dimensional coordinate space, the 60 points are concentrated on a certain area of the coordinate space. In this case, it is possible to define a coordinate value and a radius of a center of a sphere enveloping the 60 points. The coordinate value and the radius of the center correspond to parameters of the statistical model. In other words, when a distance between the point indicating the operation data serving as the diagnosis target and the center of the sphere is less than the radius of the sphere, the device is diagnosed as being normal.

The physical model is a model in which the operation data of the diagnosis target is applied to an upper limit or lower limit threshold value which is physically derived from a design condition of a device, an equation of motion, and a natural law such as a law of conversation of energy. The following Formula 1 is an example of the physical model for diagnosing the braking system of the vehicle and is configured with one equation and two conditional expressions. Formula 1 has "v" as the input variable, "L" as the output variable, and "μ," "θ," and "Th" as the parameters.

$$L = v^2/2g(\mu \cos\theta - \sin\theta)$$

If "L≤Th," the "braking system is normal." If "L>Th," the "braking system is abnormal."
(Formula 1)

L indicates a distance by which the vehicle has traveled until the vehicle stops after the braking starts. "v" is a speed of the vehicle at a time point at which the braking starts. "g" is gravitational acceleration (constant). "μ" is a coefficient of friction between the road surface and the tire of the vehicle. "μ" varies greatly depending on the precipitation. "θ" is a road gradient. "Th" is a threshold value applied to L. "Th" changes depending on μ and θ.

In a case in which μ is constant, a value of "μ cos θ−sin θ" gradually decreases as the road gradient θ gradually increases from 0. In this case, L gradually increases. In a case in which θ is constant, the value of "μ cos θ−sin θ" gradually increases as the coefficient μ of friction gradually increases. In this case, L gradually decreases.

The physical model logically determines whether a device is normal or abnormal, whereas the statistical model empirically determines whether a device is normal or abnormal. Both the physical model and the statistical model are assumed to diagnose the operation data obtained from a certain device in a certain driving environment. At this time, when a device is diagnosed as being "abnormal" by the physical model, the device may be diagnosed as being "normal" by the statistical model, and vice versa.

It is difficult to decide a diagnosis result to be more emphasized unconditionally when both diagnosis results are contrary. However, in the present embodiment, more emphasis is assumed to be placed on the diagnosis result of the statistical model. This is because a person who is in a field determines whether or not a device is normal when the learning data is accumulated, and judgment of the person who is directly observing the device is emphasized. Furthermore, this is because the reliability of the statistical model increases as an amount of accumulated learning data increases. However, if fulfilling learning data is not acquired, the reliability of the statistical model is low.

The knowledge model is generated on the basis of an operation and maintenance experience and know-how, and patterns of a cause of a failure and countermeasures are generated as a cause-effect relation between a cause and an effect. Examples of the knowledge model include failure mode effects analysis (FMEA) and failure tree analysis (FTA). Similarly to the statistical model, even in the knowledge model, enormous experiences (real data) are necessary until knowledge is obtained. In this regard, in the present embodiment, the knowledge model is dealt as a model similar to the statistical model.

The physical model may be more significant than the statistical model since it is possible to a tentative diagnosis result in any case. In short, it is important that the statistical model is preferentially used, the learning is repeated, and when the statistical model is unable to be used due to special circumstances such as device specification change, the physical model is temporarily used.

A driving environment will be described with reference to FIG. 1. A vehicle 5 (see also FIG. 6) has traveled in a period of 15:00 to 20:00 on a certain day. In a period of 15:00 to 16:00, a road gradient was ±0 degrees (flat), and a traffic volume (an amount of traffic per lane on a road) was 30 vehicles/minute. The temperature was 30° C. and the humidity was 20%. These values are average values for one hour. The device diagnostic apparatus acquires these numerical values from the vehicle 5 or from an external server such as a government agency. Further, this period is assumed not to include 15:00 and 16:00 (the same hereinafter).

Here, each of a road gradient 52, a traffic volume 53, a temperature 54, and humidity 55 is the driving environment. Of course, there are many examples as the driving environment in addition to these values. A driving environment ID 51 is assigned to a combination of the driving environment values. For example, a driving environment ID "RC01" is assigned to a combination of the road gradient "±0 degrees," the traffic volume "30 units/minute," the temperature "30° C.," and the humidity "20%." Each of the driving environments changes independently as the vehicle 5 travels. In FIG. 1, each driving environment changes at intervals of one hour. Then, another driving environment ID is given to a combination of the driving environment values in each time zone.

It will be appreciated that each of the driving environments actually changes momentarily. For example, it is not normal when the temperature value "30° C." (the average value) is the same in different periods. Therefore, here, a combination of values includes, for example, a combination of ranges such as ±2.5° C. from 30° C. by implication. Hereinafter, a "combination of values of the driving environments" or a "combination of ranges of the driving environments" is simply referred to as a "driving environment."

Figure 2:
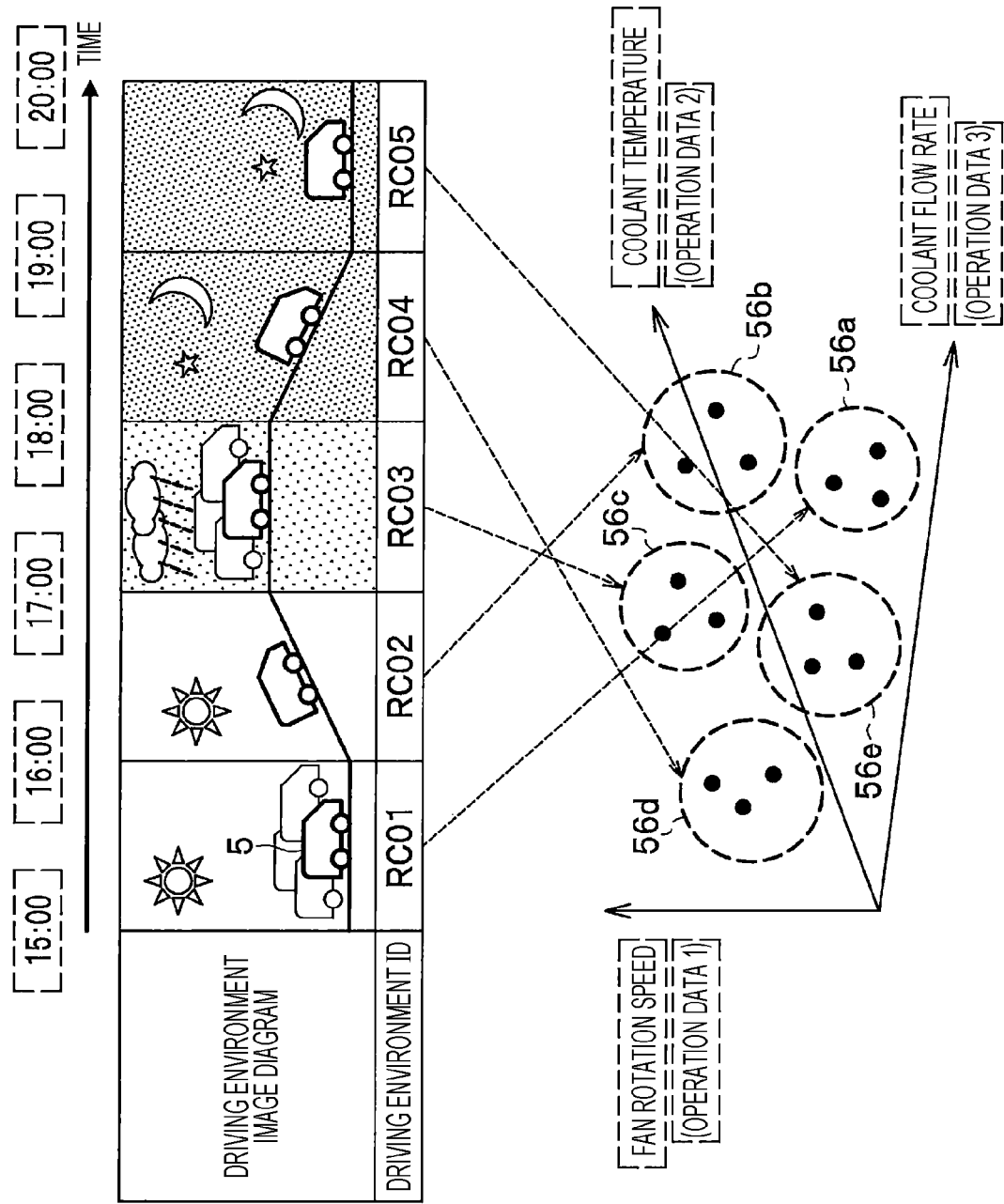
FIG. 2 is a diagram for describing generation of a statistical model.

Generation of the statistical model will be described with reference to FIG. 2. The device diagnostic apparatus diagnoses, for example, the cooling device of the vehicle 5. To this end, the device diagnostic apparatus acquires a fan rotation speed (operation data 1), a coolant temperature (operation data 2), and a coolant flow rate (operation data 3) from the sensor of vehicle 5 as the learning data. In FIG. 2, it is assumed to be known that the cooling device of the vehicle 5 is normal in the period of 15:00 to 20:00. Then, the device diagnostic apparatus is assumed to acquire the operation data at intervals of 20 minutes.

Three-dimensional operation data is acquired three times as the learning data in a period of 15:00 to 16:00. The device diagnostic apparatus plots three points indicating three pieces of operation data in a coordinate space having the fan rotation speed, the coolant temperature, and the coolant flow rate as coordinate axes. Then, the device diagnostic apparatus generates a sphere 56a as a space enveloping the three points (●) (in the present embodiment, the shape of the space is described as being a sphere). The sphere has the smallest radius among the spheres including a plurality of points (●) in its inside or the surface.

Three-dimensional operation data is acquired three times as the learning data even in a period of 16:00 to 17:00. Therefore, the device diagnostic apparatus generates a sphere 56b as described above. The device diagnostic apparatus repeats the same process even in a subsequent time zone. Then, five spheres 56a, 56b, 56c, 56d, and 56e are generated in the coordinate space. There are cases in which two or more spheres share the same area (overlap partially). However, for the sake of simplicity of description, the spheres are assumed not to overlap one another.

In a driving environment "RC04" of a period of 18:00 to 19:00, the vehicle 5 is traveling downhill while the temperature is relatively low. Therefore, the burden on the cooling device is also relatively small. This corresponds to the fact that the sphere 56d generated (learned) in accordance with the operation data acquired in the time zone is located a position relatively close to the origin of the coordinate space. Conversely, in the driving environment "RC02" of the period of 16:00 to 17:00, the vehicle 5 is traveling uphill while the temperature is relatively high. Therefore, the burden on the cooling device is also relatively large. This corresponds to the fact that the sphere 56b generated in accordance with the operation data acquired in the time zone is located relatively far from the origin of the coordinate space.

As described above, one sphere is generated for each of the five driving environments. The fact that five spheres are scattered in the coordinate space means that the sensor value varies depending on the driving environment although the operation data indicates the same "normal."

Figure 3:
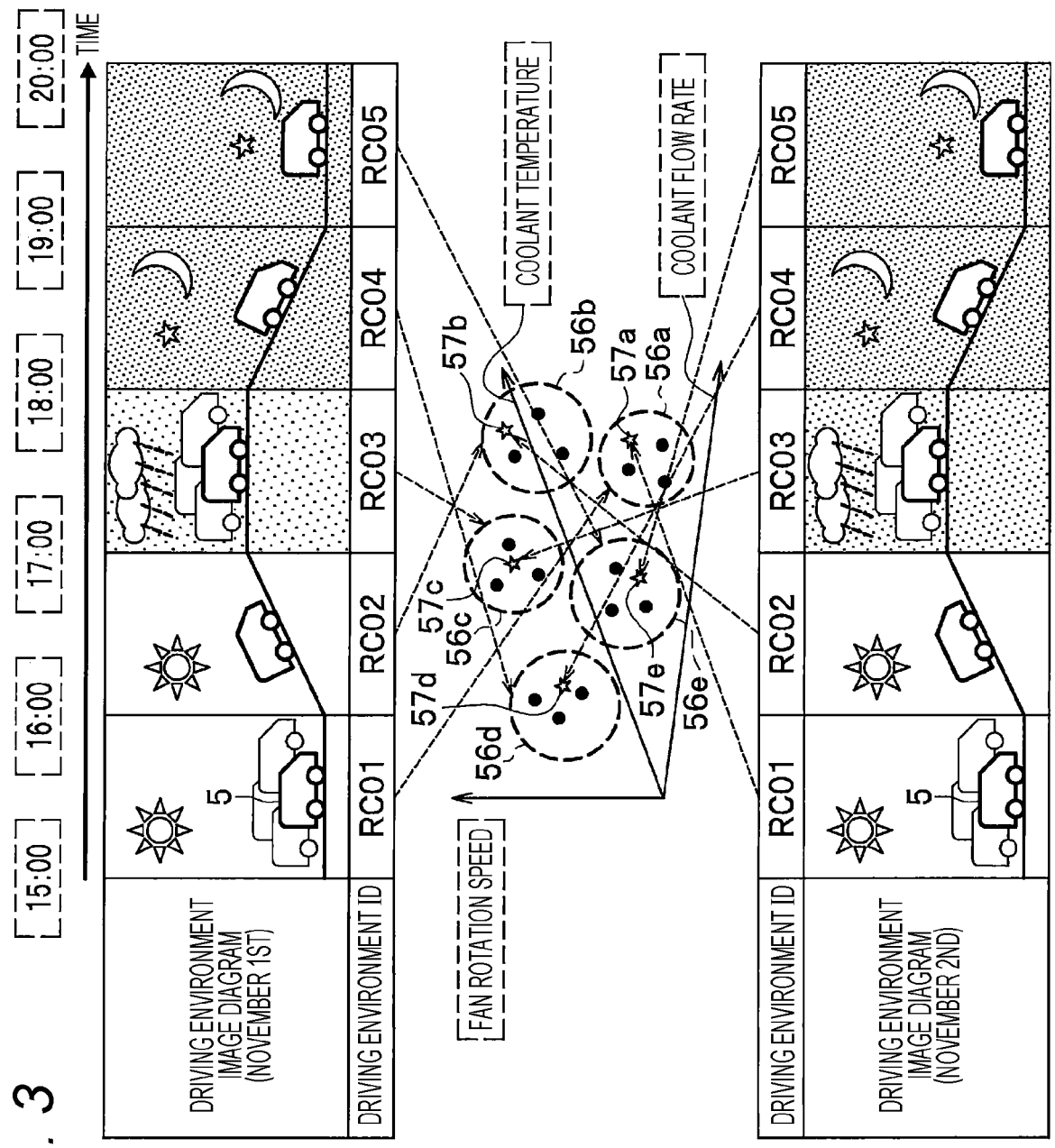
FIG. 3 is a diagram for describing use of a statistical model.

The use of the statistical model will be described with reference to FIG. 3. In a period of 15:00 to 20:00 on November 1, the vehicle 5 has traveled and, as a result, the device diagnostic apparatus has generated five spheres in the coordinate space. The process of up to this point is the same as in FIG. 2. In the period of 15:00 to 20:00 on November 2, the vehicle 5 has traveled exactly the same course as the previous day. Further, transition of hourly driving environments of the time zone is assumed to be RC01→RC02→RC03→RC04→RC05 which is accidentally the same as the previous day. In FIG. 3, it is unknown whether the cooling device of the vehicle 5 is normal or abnormal in the period of 15:00 to 20:00 on November 2, and thus, it is assumed to be necessary to diagnose whether or not the cooling device is normal in this time zone.

At 15:00 on November 2, the device diagnostic apparatus acquired the operation data serving as the diagnosis target from the sensor of vehicle 5. The operation data is three-dimensional operation data as in FIG. 2. The device diagnostic apparatus plots a point (☆) 57a indicating the operation data in the coordinate space. Then, the device diagnostic apparatus calculates a distance between the point (☆) 57a and the center which is a representative point of the sphere 56a (in the present embodiment, the center is a representative point) and further compares the calculated distance with the radius of the sphere 56a (the radius is an example of the representative value indicating the size of the space 56a). If the distance is equal to or less than the representative value of the space 56a, that is, equal to or less than the radius of the sphere 56a, the device diagnostic apparatus diagnoses "the cooling device is normal at 15:00 on November 2." If the distance is larger than the radius, the device diagnostic apparatus diagnoses "the cooling device is abnormal at 15:00 on November 2."

Here, the reason why the device diagnostic apparatus uses the sphere 56a as a reference for comparison is as follows. The driving environment at 15:00 on November 2 is "RC01." The sphere generated in accordance with the operation data of the driving environment "RC01" on November 1 is the sphere 56a.

The device diagnostic apparatus determines whether or not the distance between the point (☆) 57b indicating the operation data acquired at 16:00 on November 2 and the center of the sphere 56b is less than or equal to the radius of the sphere 56b. Then, the device diagnostic apparatus diagnoses "the cooling device is normal at 16:00 on November 2" or "the cooling device is abnormal at 16:00 on November 2 16" in accordance with a result of determination. The same applies to the subsequent time zones. In FIG. 3, a point (☆) 57c and the sphere 56c, a point (☆) 57d and the sphere 56d, a point (☆) 57e and the sphere 56e correspond to each other as comparison targets.

The use of the statistical model will be described using another example with reference to FIG. 4. In a period of 15:00 to 20:00 on November 1, the vehicle 5 has traveled and, as a result, the device diagnostic apparatus has generated five spheres in the coordinate space. The process of up to this point is the same as in FIGS. 2 and 3. In a period of 15:00 to 20:00 on November 2, the vehicle 5 has traveled a different course from the previous day. Further, transition of hourly driving environments of the time zone is assumed to be RC02→RC01→RC03→RC05→RC04 unlike the previous day.

At 15:00 on November 2, the device diagnostic apparatus acquired the operation data serving as the diagnosis target from the sensor of vehicle 5. The operation data is three-dimensional operation data as in FIGS. 2 and 3. The device diagnostic apparatus plots a point (☆) 57a indicating the operation data in the coordinate space. The position of the point (☆) 57a in FIG. 4 is different from the position of the point (☆) 57a in FIG. 3. Then, the device diagnostic apparatus calculates a distance between the point (☆) 57a and the center of the sphere 56b, and further compares the calculated distance with the radius of the sphere 56b. If the distance is less than or equal to the radius, the device diagnostic apparatus diagnoses "the cooling device is normal at 15:00 on November 2." If the distance is larger than the radius, the device diagnostic apparatus diagnoses "the cooling device is abnormal at 15:00 on November 2."

Here, the reason why the device diagnostic apparatus uses the sphere 56b as a reference for comparison is as follows. The driving environment at 15:00 on November 2 is "RC02." The sphere generated in accordance with the operation data of the driving environment "RC02" on November 1 is the sphere 56b.

The device diagnostic apparatus determines whether or not the distance between the point (☆) 57b indicating the operation data acquired at 16:00 on November 2 and the center of the sphere 56a is less than or equal to the radius of the sphere 56a. Then, the device diagnostic apparatus diagnoses "the cooling device is normal at 16:00 on November 2" or "the cooling device is abnormal at 16:00 on November 2 16" in accordance with a result of determination. The same applies to the subsequent time zones. In FIG. 4, a point (☆) 57c and the sphere 56c, a point (☆) 57d and the sphere 56e, a point (☆) 57e and the sphere 56d correspond to each other as comparison targets.

The use of the physical model will be described with reference to FIG. 5. Here, the physical model has the following features. In the physical model, the fan rotation speed, the coolant temperature, and the coolant flow rate are used as the input variables. In the physical model, a cooling capability is used as the output variable. The physical model has parameters other than the input variable and the output variable. In the physical model, a threshold value (an upper limit and a lower limit) is applied to cooling capability. The value of the parameter and the value of the threshold value change depending on the driving environment.

For the physical model, there is no concept of generating (learning) the physical model using the learning data. In other words, in the physical model, as described in FIGS. 3 and 4, a meaning roundabout process of firstly generating the diagnosis model using the learning data of November 1 and using the result later is not necessary. In FIG. 5 it is unknown whether the cooling device of the vehicle 5 is normal or abnormal in the period of 15:00 to 20:00 on November 1, and thus, it is assumed to be necessary to diagnose whether or not the cooling device is normal in this time zone. At this time, the physical model diagnoses the cooling device in real time.

Figure 4:
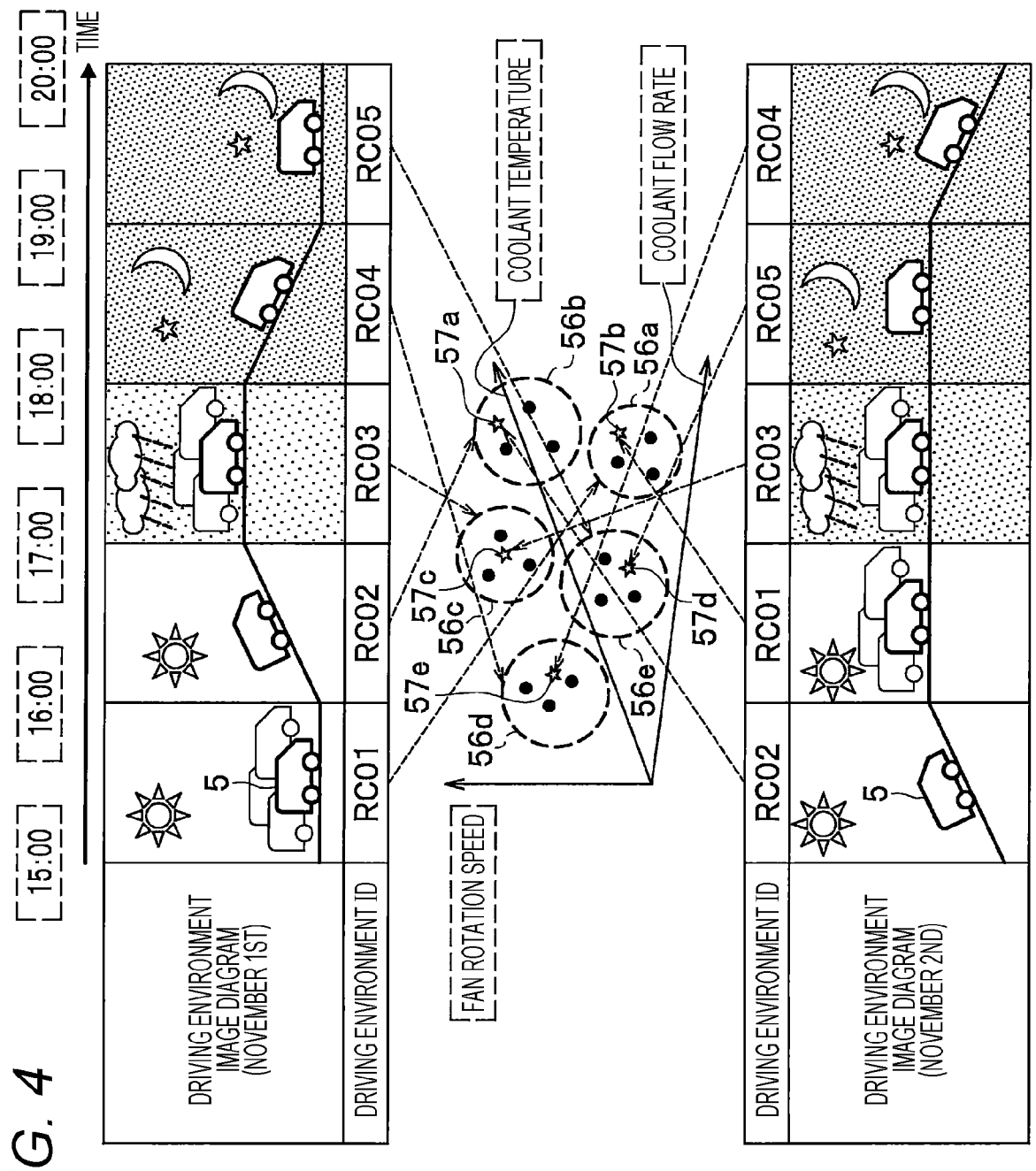
FIG. 4 is a diagram for describing use of a statistical model.
Figure 5:
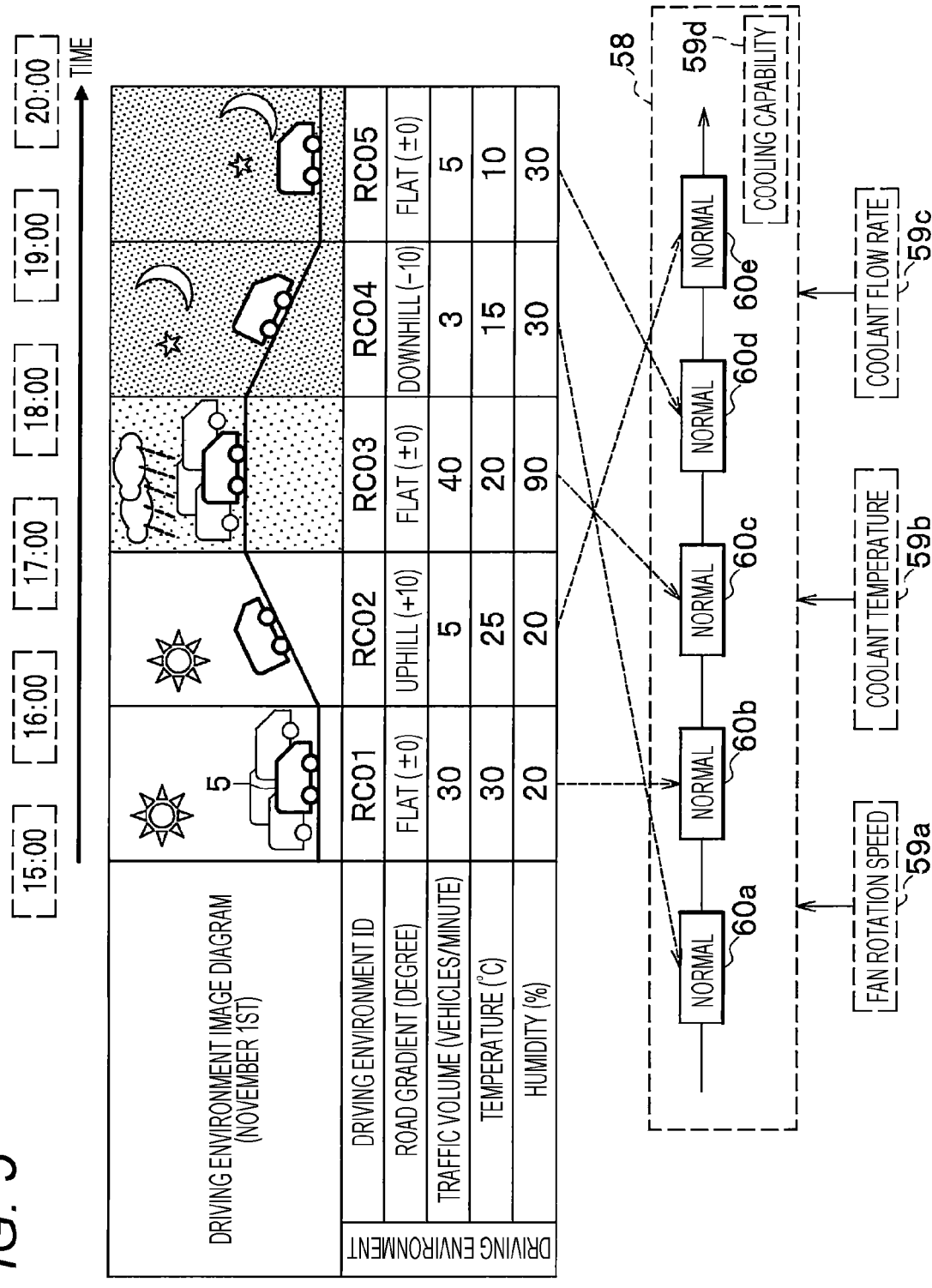
FIG. 5 is a diagram for describing use of a physical model.

In FIG. 5, similarly to FIGS. 3 and 4, the vehicle 5 has traveled in the period of 15:00 to 20:00 on November 1. Transition of the driving environment is RC01→RC02→RC03→RC04→RC05, similarly to FIGS. 3 and 4. At 15:00 on November 1, the device diagnostic apparatus acquired the operation data serving as the diagnosis target from the sensor of vehicle 5. The operation data is three-dimensional operation data as in FIGS. 2 and 3.

In this case, the device diagnostic apparatus first sets the value of the parameter of the physical model 58 in accordance with the driving environment "RC01," and then inputs operation data 59a, 59b, and 59c at 15:00 on November 1 to the physical model 58. The device diagnostic apparatus subsequently determines whether or not a cooling capability 59d output from the physical model 58 is within a range value 60b of a threshold value (upper limit and lower limit) corresponding to the driving environment "RC01."

If the cooling capability 59d is within the range value 60b of the threshold value, the device diagnostic apparatus diagnoses "the cooling device is normal at 15:00 on November 1." If the cooling capability 59d is not within the range value 60b of the threshold value, the device diagnostic apparatus diagnoses "the cooling device is abnormal at 15:00 on November 1."

In the physical model 58 of FIG. 5, ranges 60a, 60b, 60c, 60d, and 60e of the threshold value of the cooling capability (horizontal axis) are set. The positions (upper and lower limits) on the horizontal axis correspond to the driving environments RC04, RC01, RC03, RC05, and RC02. The ranges of the threshold value may overlap each other. In FIG. 5, in order to facilitate understanding, an example in which the ranges of the threshold value do not overlap is illustrated. By the way, in FIG. 5, the range 60e of the threshold value having the largest value of the horizontal axis corresponds to the driving environment RC02 which is considered to have the largest burden on the cooling device. The range 60a of the threshold value having the smallest value of the horizontal axis corresponds to the driving environment RC04 which is considered to have the least burden on the cooling device.

At 16:00 on November 1, the device diagnostic apparatus performs a similar process. Here, at this time, the device diagnostic apparatus determines whether or not the cooling capability 59d output by the physical model 58 is within the range 60e of the threshold value corresponding to the driving environment "RC02." At 17:00 (18:00 and 19:00) on November 1, the device diagnostic apparatus performs a similar process.

(Configuration of Device Diagnostic Apparatus)

Figure 6:
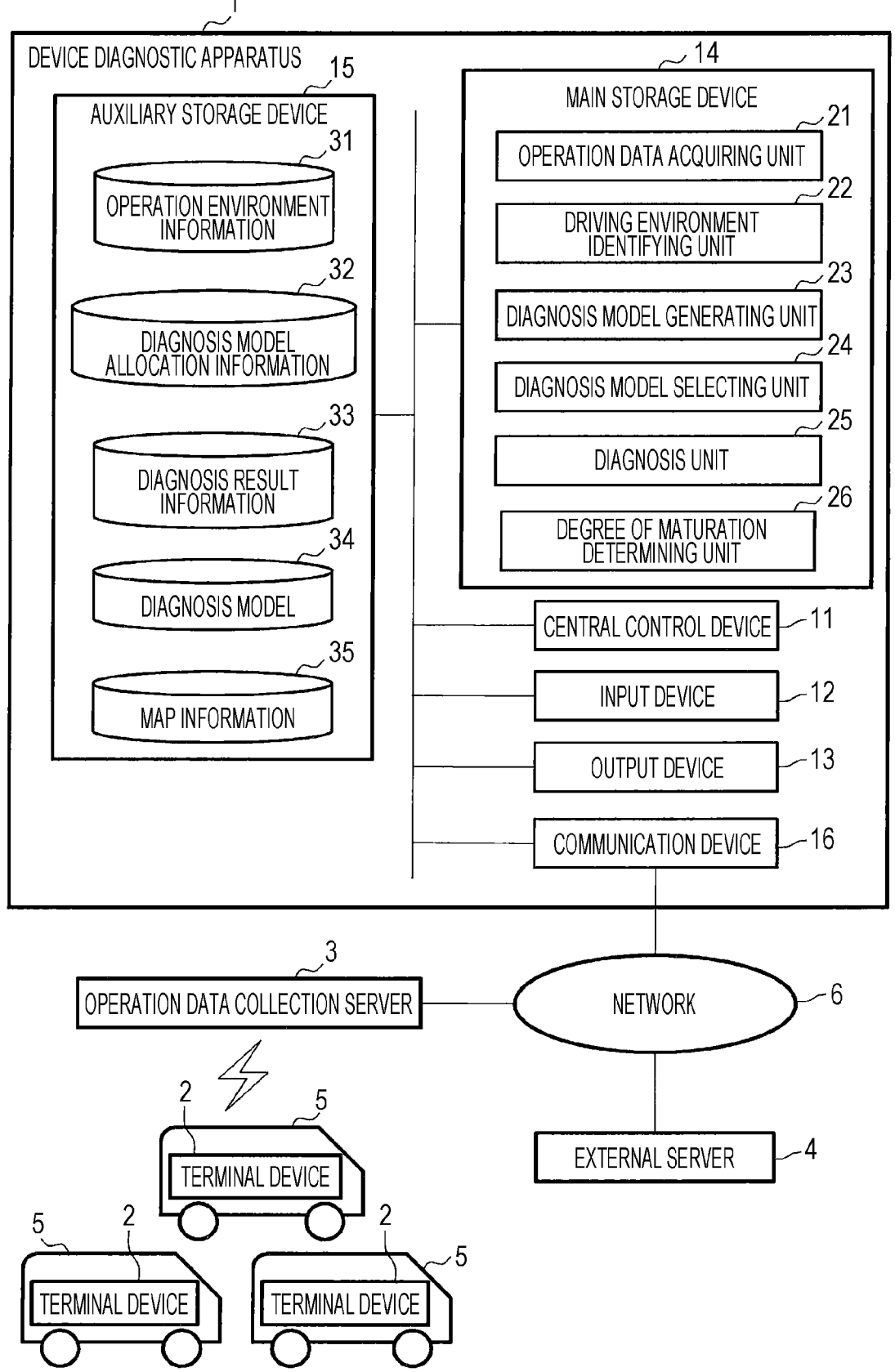
FIG. 6 is a diagram for describing a configuration of a device diagnostic apparatus.

A configuration of a device diagnostic apparatus 1 will be described with reference to FIG. 6. The device diagnostic apparatus 1 is a general computer. The device diagnostic apparatus 1 includes a central control device 11, an input device 12, an output device 13, a main storage device 14, an auxiliary storage device 15, and a communication device 16. These components are connected to one another via a bus. The auxiliary storage device 15 stores operation/environment information 31, diagnosis model allocation information 32, diagnosis result information 33, diagnosis model 34, and map information 35. An operation data acquiring unit 21, a driving environment identifying unit 22, a diagnosis model generating unit 23, a diagnosis model selecting unit 24, a diagnosis unit 25, and a degree of maturation determining unit 26 in the main storage device 14 are programs. In the following description, when a "◯◯ unit" is described as a main operation entity, it means that the central control device 11 reads the ◯◯ unit from the auxiliary storage device 15, loads the ◯◯ unit onto the main storage device 14, and then implements a function of the ◯◯ unit (to be described in detail later).

The device diagnostic apparatus 1 is able to perform communication with an external server 4 and an operation data collection server 3 via a network 6. The external server 4 is a server operated by a government agency or the like. The external server 4 stores the weather and road attributes in association with position information. The vehicle 5 includes a terminal device 2 therein. The terminal device 2 is able to collect the sensor values from the sensors of the vehicle 5, receive radio waves from global positioning system (GPS) satellites, and calculate its own position information (latitude and longitude). The operation data collection server 3 is able to perform communication with the terminal device 2 using wireless technology. As apparent from the above description, the device diagnostic apparatus 1 is able to acquire the operation data and the position information of the vehicle 5 via the network 6 and the operation data collection server 3. Further, the device diagnostic apparatus 1 is able to acquire the driving environment of the vehicle 5 via the network 6 and the operation data collection server 3. The device diagnostic apparatus 1 is also able to acquire the driving environment of the vehicle 5 from the external server 4 via the network 6 on the basis of the position information of the vehicle 5.

(Operation/Environment Information)

The operation/environment information 31 will be described with reference to FIG. 7. In the operation/environment information 31, in association with a vehicle ID stored in a vehicle ID field 101, position is stored in a position field 102, a time point is stored in a time point field 103, the operation data is stored in an operation data field 104, and the driving environment is stored in a driving environment field 105. The vehicle ID of the vehicle ID field 101 is an identifier uniquely identifying the vehicle 5. The position of the position field 102 is position information (longitude and latitude) of the vehicle 5 at the time point. The time point of the time point field 103 is a year, month, day, hour, minute, and second of the time point at which the operation data is acquired by the sensor.

The operation data of the operation data field 104 is the operation data described above. There are three types of operation data, that is, the coolant temperature (field 104*a*), the coolant flow rate (field 104*b*), and the fan rotation speed (field 104*c*), but the type of operation data also changes depending on the type of device. The driving environment of the driving environment field 105 is the driving environment of the time point at the position. There are four types of driving environments, that is, the road gradient (field 105*a*), the traffic volume (field 105*b*), the temperature (field 105*c*), and the humidity (field 105*d*), but other types may be used. For example, the traffic volume may be replaced with traffic information such as a travel time of a predetermined interval, a travel speed, a congestion degree, or the like. Further, a road shape (a straight road, a curved road, a curve curvature, or the like), a road type (a freeway, a general road, or the like), a road attribute (an intersection, a tunnel, a bridge, a gradient, a railroad crossing, a road width, the number of lanes, or the lime), additional road information (a traffic signal, a pedestrian crossing, or a stop line position), or the like may be used as the driving environment.

(diagnosis Model Allocation Information)

The diagnosis model allocation information 32 will be described with reference to FIG. 8. In the diagnosis model allocation information 32, in association with the driving environment ID stored in the driving environment ID field 111, the range of the driving environment is stored in a driving environment field 112, a statistical model ID is stored in a statistical model ID field 113, a physical model ID is stored in a physical model ID field 114, and a recommended model ID is stored in a recommended model ID field 115.

The driving environment ID of the driving environment ID field 111 is an identifier uniquely identifying the driving environment (a combination of ranges of the driving environments). The range of the driving environment of the driving environment field 112 is a classification when a range which can be taken by each driving environment is divided into arbitrary numbers. For example, when the road gradient (field 112*a*) is divided into two classifications using "0" as a boundary, the classifications of the road gradient are "positive (uphill)" and "negative (downhill)." Further, "±0" indicating a flat road is included in "negative (downhill)."

The traffic volume (field 112*b*) is divided into two classifications of "less than 10" and "10 or more" using "10" as the boundary. Similarly, the temperature (field 112*c*) is divided into two classifications of "less than 20" and "20 or more," and the humidity (field 112*d*) is divided into two classifications of "less than 60" and "60 or more".

The statistical model ID of the statistical model ID field 113 is an identifier uniquely identifying the statistical model. For example, each of the spheres 56*a*, . . . , 56*e* in FIG. 2 corresponds to the statistical model. The statistical model ID here identifies the statistical model generated using the operation data (learning data) acquired in the driving environment. If "none (not learned)" is stored in the field, it means that the statistical model for the driving environment is not prepared yet, for example, since the device is updated, and the learning data is not sufficiently obtained.

The physical model ID of the physical model ID field 114 is an identifier uniquely specifying the physical model. The physical model is prepared for all the driving environments. Instead, the number of types of physical model is smaller than that of the statistical model, and in FIG. 8, there are two types, that is, "MM 01" for downhill and "MM 02" for uphill. The recommended model ID of the recommended model ID field 115 is an identifier uniquely identifying the diagnosis model which is recommended to be used for the device diagnosis in the driving environment. In the present embodiment, the recommended model ID specifying the statistical model is stored in the field of the record (row) in which both the statistical model and the physical model are prepared. The recommended model ID specifying the physical model is stored in the field of the record (row) in which only the physical model is prepared.

(Diagnosis Result Information)

The diagnosis result information 33 will be described with reference to FIG. 9. In the diagnosis result information 33, in association with a vehicle ID stored in a vehicle ID field 121, a position is stored in a position field 122, a time point is stored in a time point field 123, the operation data is stored in an operation data field 124, a driving environment ID is stored in a driving environment ID in 125, an used diagnosis model ID is stored in an used diagnosis model ID field 126, a model diagnosis result is stored in a model diagnosis result field 127, a maintenance worker diagnosis result is stored in a maintenance worker diagnosis result field 128, and an evaluation flag is stored in a model evaluation field 129.

The vehicle ID of the vehicle ID field 121 is the same as the vehicle ID in FIG. 7. The position of the position field 122 is the same as the position of FIG. 7. The time point of the time point field 123 is the same as the time point in FIG. 7. However, the time point of FIG. 7 is a time point at which the operation data is acquired by the sensor as the learning data, whereas the time point of FIG. 8 is a time point at which the operation data is acquired by the sensor as the diagnosis target. The operation data of the operation data field 124 is the same as the operation data of FIG. 7. Here, the operation data is operation data of the diagnosis target other than the learning data. Further, "(#,#,#)" indicates the three-dimensional operation data whose value varies for each record by implication. The driving environment ID of the driving environment ID field 125 is the same as the driving environment ID of FIG. 8.

The used diagnosis model ID of the used diagnosis model ID field 126 is an identifier identifying the diagnosis model actually used for diagnosis. Normally, when the driving environment is the same, the used diagnosis model ID (FIG. 9) is identical to the recommended model ID (FIG. 8). The model diagnosis results of the model diagnosis result field 127 is the diagnosis result (normal/abnormal) according to the diagnosis model specified by the used diagnosis model ID. The maintenance worker diagnosis results of the maintenance worker diagnosis result field 128 is a diagnosis result (normal/abnormal) made by the maintenance worker whose has actually observed the device separately from the diagnosis result output by the diagnosis model after the diagnosis models outputs the diagnosis result. Even when the model diagnosis result is "normal," the maintenance worker diagnosis result may be "abnormal," or vice versa.

The evaluation flag of the model evaluation field 129 is either "O" or "X." "O" indicates that the model diagnosis result coincides with the maintenance worker diagnosis result. "X" indicates that the model diagnosis result does not coincide with the maintenance worker diagnosis result.

The processing procedure will be described with reference to FIGS. 10 to 12. There are six processing procedures, that is, a statistical model generation processing procedure, a physical model generation processing procedure, a diagnosis model selection processing procedure, a diagnosis processing procedure, a degree of maturation determination processing procedure, and a terminal center collaboration processing procedure.

(Statistical Model Generation Processing Procedure)

Figure 10A:
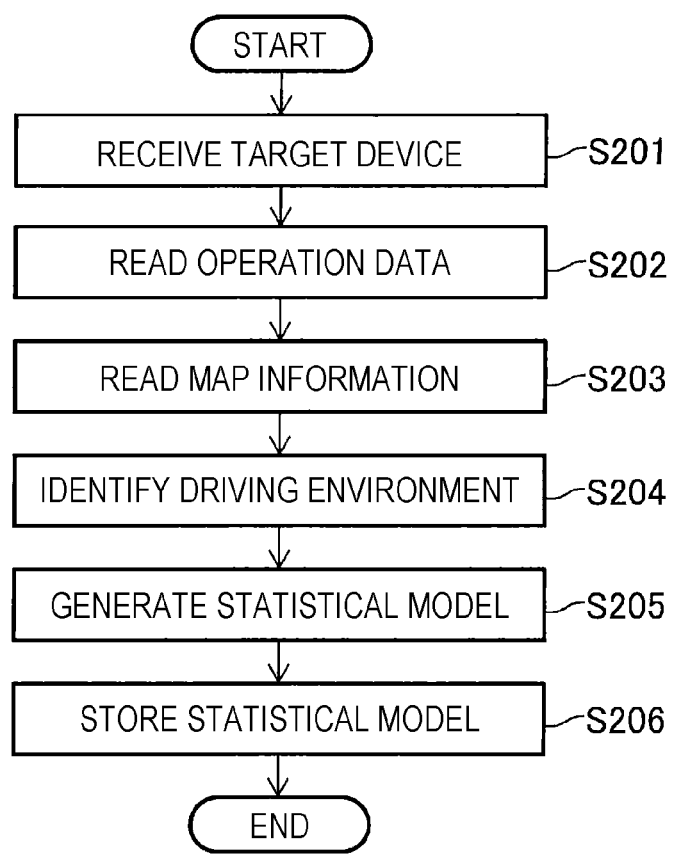
FIG. 10A is a flowchart of a statistical model generation processing procedure.

The statistical model generation processing procedure will be described with reference to FIG. 10A. As a premise to start the statistical model generation processing procedure, it is assumed that the vehicle 5 is traveling, and the terminal device 2 is transmitting the operation data (learning data) and the position information of the vehicle 5 to the device diagnostic apparatus 1 in real time. In step S201, the operation data acquiring unit 21 of the device diagnostic apparatus 1 receives a target device. Specifically, the operation data acquiring unit 21 receives a device serving as the diagnosis target which is input by the user of the device diagnostic apparatus 1 through the input device 12 among the devices of the vehicle 5. Here, examples of the diagnosis target here include the "braking system," the "engine system," the "steering system," the "cooling system," and the like. Here, the "cooling system" is assumed to be input.

In step S202, the operation data acquiring unit 21 reads the operation data. Specifically, the operation data acquiring unit 21 acquires the operation data related to the cooling device (the coolant temperature, the coolant flow rate, and the fan rotation speed) among the operation data received by the device diagnostic apparatus 1, and stores the vehicle ID field 101 to the operation data field 104 of the operation/environment information 31 (FIG. 7).

In step S203, the driving environment identifying unit 22 of the device diagnostic apparatus 1 reads the map information 35. Specifically, firstly, the driving environment identifying unit 22 acquires the road gradient at the position of the vehicle 5 with reference to the map information 35 using the position information of the vehicle 5 as a search key. Secondly, the driving environment identifying unit 22 acquires the traffic volume, the temperature, and the humidity at the position of the vehicle 5 at that time point with reference to the external server 4 using the position information of the vehicle 5 as a search key. Thirdly, the driving environment identifying unit 22 generates the driving environment field 105 of the operation/environment information 31 (FIG. 7) using the information acquired in "firstly" and "secondly" in step S203.

In step S204, the driving environment identifying unit 22 identifies the driving environment. Specifically, the driving environment identifying unit 22 applies a combination of the road gradient, the traffic volume, the temperature, and the humidity acquired in "firstly" and "secondly" in step S203 to the driving environment field 112 of the diagnosis model allocation information 32 (FIG. 8), and acquires the corresponding driving environment ID. The auxiliary storage device 15 is assumed to store the driving environment ID field 111 and the driving environment field 112 of the diagnosis model allocation information 32 in advance.

The operation data acquiring unit 21 and the driving environment identifying unit 22 repeat the process of steps S202 to S204 each time the operation data is acquired. For example, when several hours elapse while repeating such a process, the operation data acquiring unit 21 temporarily stores a large number of operation data (three dimensions of the coolant temperature, the coolant flow rate, and the fan rotation speed) in the main storage device 14 in association with the driving environment ID.

In step S205, the diagnosis model generating unit 23 of the device diagnostic apparatus 1 generates the statistical model. Specifically, the diagnosis model generating unit 23 plots the operation data serving as the learning data on the coordinate plane, and obtains the position coordinates of the center of the sphere and the radius as described above with reference to FIG. 2.

In step S206, the diagnosis model generating unit 23 stores the statistical model. Specifically, firstly, the diagnosis model generating unit 23 assigns the statistical model ID, and stores the assigned statistical model D in the auxiliary storage device 15 as the diagnosis model 34 (FIG. 6) in association with the position coordinates of the center and the radius obtained in step S205. Secondly, the diagnosis model generating unit 23 stores the statistical model ID in the statistical model ID field 113 of the diagnosis model allocation information 32 (FIG. 8).

The diagnosis model generating unit 23 repeats the process of steps S205 and S206 for each driving environment ID. Thereafter, the statistical model generation processing procedure ends. If the statistical model generation processing procedure is continued for a sufficiently long period, the statistical model ID is acquired for most of combinations of driving environments. In other words, in the diagnosis model allocation information 32, there is no record in which the statistical model ID field 113 is "none (not learned)." In the above example, combinations of driving environments are defined in advance, and the spheres are generated within the coordinate space for each combination (for each set of similar operation data). In other words, the number of spheres is known in advance (16 spheres in this example). However, the diagnosis model generating unit 23 may generate an arbitrary number of spheres using a known k—means technique or the like without deciding the number of spheres in advance. The statistical model generation processing procedure is repeated for each target device.

(Physical Model Generation Processing Procedure)

Figure 10B:
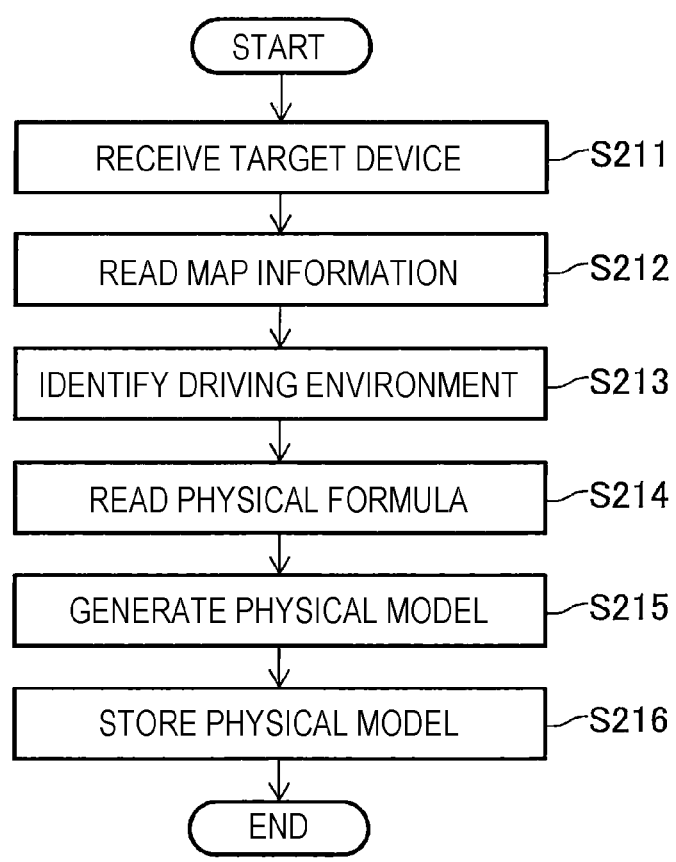
FIG. 10B is a flowchart of a physical model generation processing procedure.

The physical model generation processing procedure will be described with reference to FIG. 10B. As a premise to start the physical model generation processing procedure, it is assumed that the vehicle 5 is traveling, and the terminal device 2 is transmitting the operation data and the position information of the vehicle 5 to the device diagnostic apparatus 1 in real time. In step S211, the operation data acquiring unit 21 of the device diagnostic apparatus 1 receives the target device. Content of this step including that the user inputs the "cooling system" is the same as step S201.

In step S212, the driving environment identifying unit 22 of the device diagnostic apparatus 1 reads the map information. Specifically, firstly, the driving environment identifying unit 22 acquires the road information (the road shape, the road attribute, the road type, the additional road information, or the like) at the position of the vehicle 5, that is, the road gradient in the present embodiment with reference to the map information 35 using the position information of the vehicle 5 as a search key Secondly, the driving environment identifying unit 22 acquires the traffic volume, the temperature, and the humidity at the position of the vehicle 5 at that time point with reference to the external server 4 using the position information of the vehicle 5 as a search key.

In step S213, the driving environment identifying unit 22 identifies the driving environment. Specifically, the driving environment identifying unit 22 applies a combination of the road gradient, the traffic volume, the temperature, and the humidity acquired in "firstly" and "secondly" in step S212 to the driving environment field 112 of the diagnosis model allocation information 32 (FIG. 8), and acquires the corresponding driving environment ID.

In step S214, the diagnosis model generating unit 23 of the device diagnostic apparatus 1 reads a physical formula. Here, for example, the physical formula is a set of mathematical expressions such as in Formula 1, and the auxiliary storage device 15 is assumed to store the physical formula (the parameter value is not yet determined at this stage) for each device of the diagnosis target. Specifically, the diagnosis model generating unit 23 acquires the physical formula corresponding to the device of the diagnosis target.

In step S215, the diagnosis model generating unit 23 generates the physical model. Specifically, firstly, the diagnosis model generating unit 23 receives the value of the parameter of the physical model which corresponds to the driving environment specified by the driving environment ID acquired in step S213 and is input through the input device 12. Here, the diagnosis model generating unit 23 may calculate the parameter value corresponding to the driving environment with no manual input by the user. Secondly, the diagnosis model generating unit 23 substitutes the parameter value acquired in "firstly" in step S215 into the parameter of the physical formula acquired in step S214.

In step S216, the diagnosis model generating unit 23 stores the physical model. Specifically, firstly, the diagnosis model generating unit 23 assigns the physical model ID and stores the assigned physical model ID in the auxiliary storage device 15 as the diagnosis model 34 (FIG. 6) in association with the physical formula into which the parameter value is substituted in "secondly" in step S215. Secondly, the diagnosis model generating unit 23 stores the physical model ID in the physical model ID field 114 of the diagnosis model allocation information 32 (FIG. 8). Thereafter, the physical model generation processing procedure ends.

A physical formula in which a specific value is input as the parameter value becomes the "physical model," and the physical model ID is given (assigned) to each physical model. Unlike the statistical model, a physical model specific to each driving environment ID need not be necessarily generated. This is because the physical model supplements a temporary lack of the statistical model.

Usually, one physical formula is prepared for each device of the diagnosis target. It is not necessary to change the parameter value finely each time the driving environment changes even slightly. In the present embodiment, the diagnosis model generating unit 23 changes the parameter value in accordance with the sign (positive or negative) of the road gradient for the same physical formula. "MM 01" and "MM 02" of the physical model ID field 114 of FIG. 8 indicate this. The physical model generation processing procedure is repeated for each target device.

(Diagnosis Model Selection Processing Procedure)

Figure 11A:
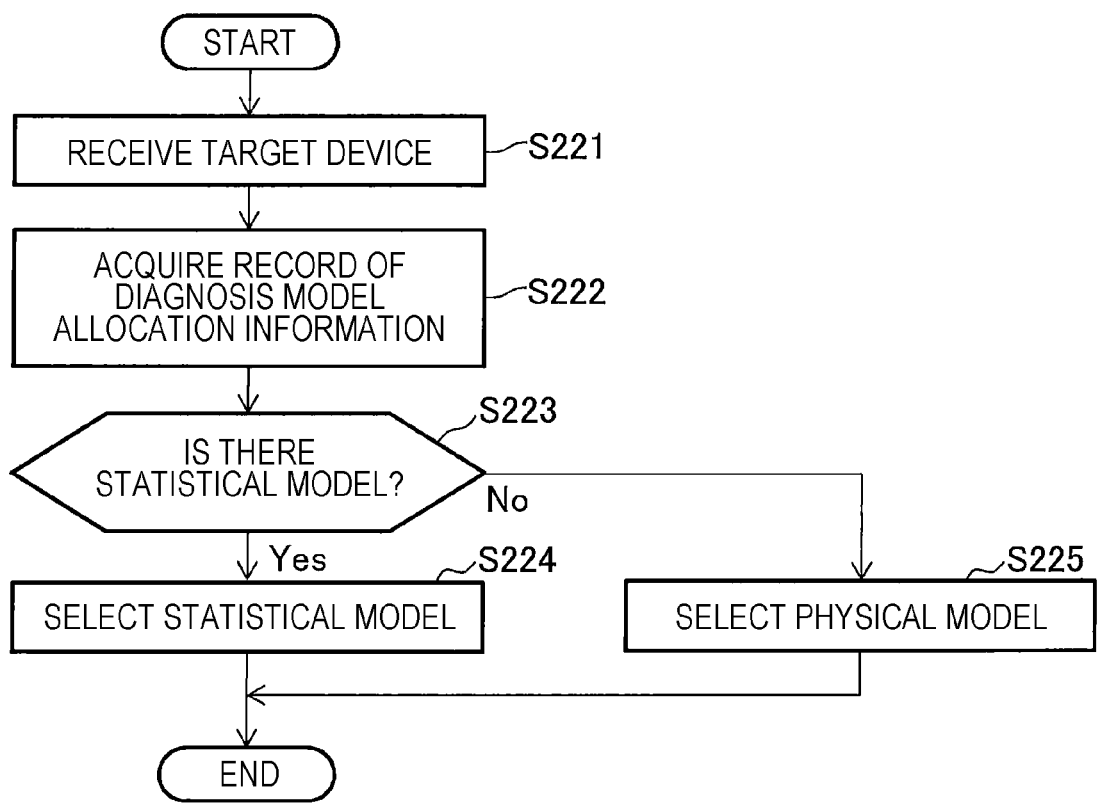
FIG. 11A is a flowchart of a diagnosis model selection processing procedure.

The diagnosis model selection processing procedure will be described with reference to FIG. 11A. As a premise to start the diagnosis model selection processing procedure, the auxiliary storage device 15 is assumed to store the diagnosis model allocation information 32 (FIG. 8) in a state in which only the recommended model ID field 115 is an empty field. Then, the diagnosis model selection processing procedure is started when there is a change in the statistical model ID field 113 or the physical model ID field 114 of the diagnosis model allocation information 32.

In step S221, the diagnosis model selecting unit 24 of the device diagnostic apparatus 1 receives the target device. Content of this step is the same as that of step S201. In step S222, the diagnosis model selecting unit 24 acquires the record of the diagnosis model allocation information 32 (FIG. 8). Specifically, the diagnosis model selecting unit 24 acquires one unprocessed record from the records (row) of the diagnosis model allocation information 32. The record acquired here is hereinafter also referred to as a "target record."

In step S223, the diagnosis model selecting unit 24 determines whether or not there is a statistical model. Specifically, when "none (not learned)" is stored in the statistical model ID field 113 of the target record ("No" in step S223), the diagnosis model selecting unit 24 causes the process to proceed to step S225. When the statistical model ID indicating "SM" is stored in the statistical model ID field 113 of the target record ("Yes" in step S223), the diagnosis model selecting unit 24 causes the process to proceed to step S224.

As a modified example of step S223, the diagnosis model selecting unit 24 may cause the process to proceed to step S224 when the road state of the driving environment of the target record corresponds to a predetermined condition, and may cause the process to proceed to step S225 otherwise. The predetermined condition is, for example, a condition that the traffic volume is equal to or greater than a predetermined threshold value, a condition that the number of lanes is equal to or larger than the predetermined number, or the like.

In step S224, the diagnosis model selecting unit 24 selects the statistical model. Specifically, the diagnosis model selecting unit 24 stores the statistical model ID of the target record in the recommended model ID field 115 of the target record. In step S225, the diagnosis model selecting unit 24 selects the physical model. Specifically, the diagnosis model selecting unit 24 stores the physical model ID of the target record in the recommended model ID field 115 of the target record. Thereafter, the diagnosis model selection processing procedure ends. The diagnosis model selection processing procedure is repeated for each target device.

(Diagnosis Processing Procedure)

Figure 11B:
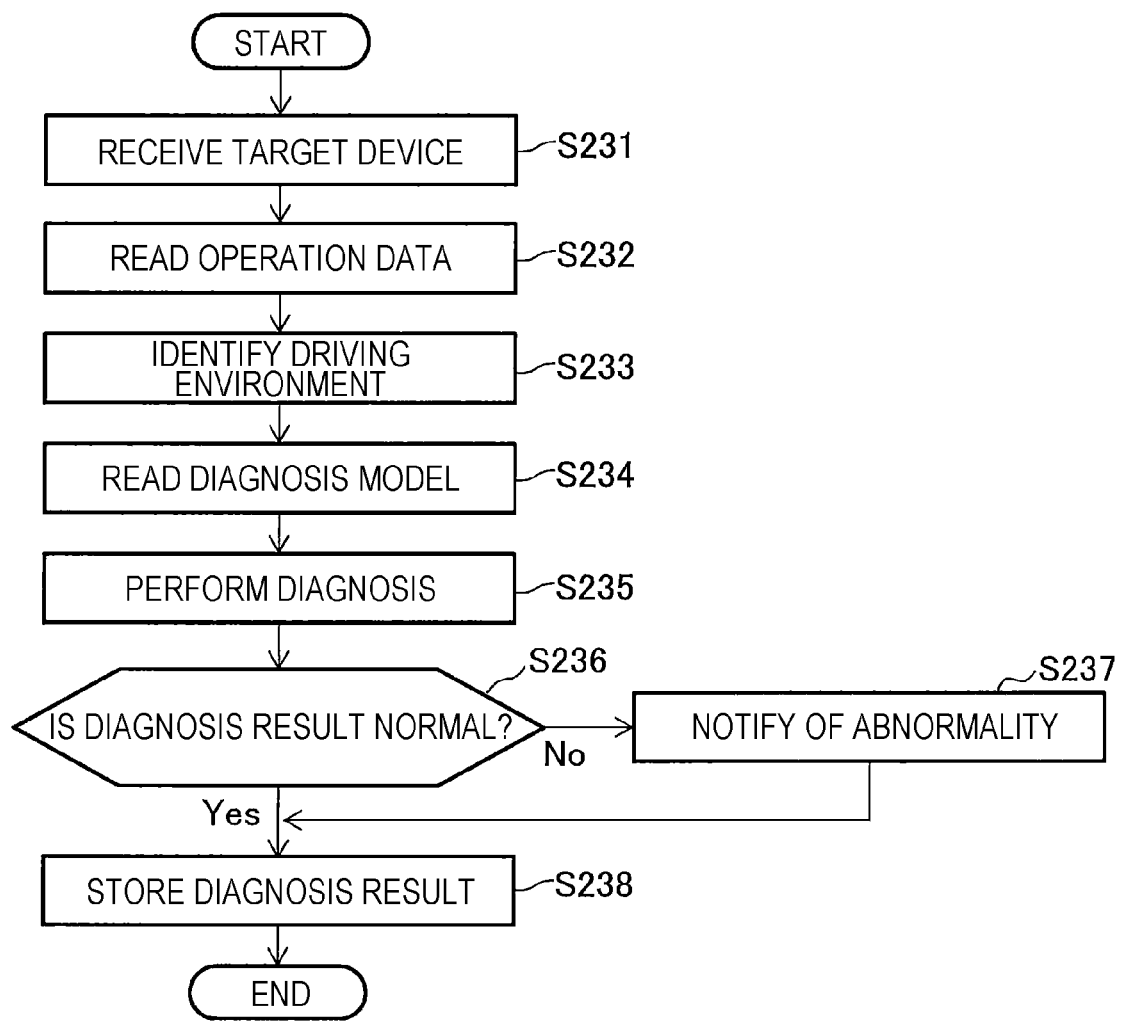
FIG. 11B is a flowchart of a diagnosis processing procedure.

The diagnosis processing procedure will be described with reference to FIG. 11B. As a premise to start the diagnosis processing procedure, it is assumed that the vehicle 5 is traveling, and the terminal device 2 is transmitting the operation data and the position information to the device diagnostic apparatus 1 as the diagnosis target of the vehicle 5 in real time. Then, when new operation data is transmitted, the diagnosis processing procedure is started. In step S231, the operation data acquiring unit 21 of the device diagnostic apparatus 1 receives the target device. Content of this step including that the user inputs the "cooling system" is the same as step S201.

In step S232, the operation data acquiring unit 21 reads the operation data. Specifically, firstly, the operation data acquiring unit 21 acquires the operation data related to the cooling device (the coolant temperature, the coolant flow rate, and the fan rotation speed) among the operation data received by the device diagnostic apparatus 1. Secondly, the operation data acquiring unit 21 generates a new record of the diagnosis result information 33 (FIG. 9), and stores values of the vehicle ID field 121 to the operation data field 124 of the new record. Here, the generated record is hereinafter also referred to as a "diagnosis result record."

In step S233, the driving environment identifying unit 22 of the device diagnostic apparatus 1 identifies the driving environment. Specifically, firstly, the driving environment identifying unit 22 acquires the road information (the road shape, the road attribute, the road type, the additional road information, or the like) at the position of the vehicle 5, that is, the road gradient in the present embodiment with reference to the map information 35 using the position information of the vehicle 5 as a search key. Secondly, the driving environment identifying unit 22 acquires the traffic volume, the temperature, and the humidity at the position of the vehicle 5 at that time point with reference to the external server 4 using the position information of the vehicle 5 as a search key.

Thirdly, the driving environment identifying unit 22 acquires the driving environment ID of the corresponding record with reference to the driving environment field 112 of the diagnosis model allocation information 32 (FIG. 8) on the basis of the information acquired in "firstly" and "secondly" in step S233. Fourthly, the driving environment identifying unit 22 stores the driving environment ID acquired in "thirdly" in step S233 in the driving environment ID field 125 of the diagnosis result record.

In step S234, the diagnosis model selecting unit 24 of the device diagnostic apparatus 1 reads the diagnosis model. Specifically, firstly, the diagnosis model selecting unit 24 acquires the recommended model ID of the corresponding record with reference to the diagnosis model allocation information 32 using the driving environment ID obtained in "thirdly" in step S233 as a search key. Secondly, the diagnosis model selecting unit 24 stores the recommended model ID acquired in "firstly" in step S234 in the used diagnosis model ID field 126 of the diagnosis result record.

In step S235, diagnosis unit 25 of device diagnostic apparatus 1 performs the diagnosis. Specifically, the diagnosis unit 25 diagnoses the operation data of the diagnosis target using the used diagnosis model (the model stored in the used diagnosis model ID field 126 in "secondly" in step S234). When the used diagnosis model is the statistical model, either "normal" or "abnormal" is decided as the diagnosis result as described above with reference to FIGS. 3 and 4. When the used diagnosis model is the physical model, either "normal" or "abnormal" is decided as the diagnosis result as described above with reference to FIG. 5.

In step S236, the diagnosis unit 25 determines whether or not the diagnosis result is normal. Specifically, when the diagnosis unit 25 is "normal" ("Yes" in step S236), the diagnosis unit 25 causes the process to proceed to step S238, and when the diagnosis result is "abnormal" ("No" in step S236), the diagnosis unit 25 causes the process to proceed to step S237.

In step S237, the diagnosis unit 25 reports the abnormality. Specifically, the diagnosis unit 25 transmits an abnormality message to the terminal device 2 of the vehicle 5 or causes the abnormality message to be displayed on the output device 13. The abnormality message is, for example, "the cooling device is abnormal." When terminal device 2 receives the abnormality message, the terminal device 2 causes the abnormality message to be displayed on the output device of the terminal device 2. In step S238, the diagnosis unit 25 stores the diagnosis result. Specifically, the diagnosis unit 25 stores either "normal" or "abnormal" in the model diagnosis result field 127 of the diagnosis result record as the diagnosis result. Thereafter, the diagnosis processing procedure ends. Further, when the diagnosis processing procedure ends, the maintenance worker diagnosis result field 128 and the model evaluation field 129 of the diagnosis result information 33 are in the empty fields. The diagnosis processing procedure is repeated for each target device.

(Degree of Maturation Determination Processing Procedure)

Figure 12A:
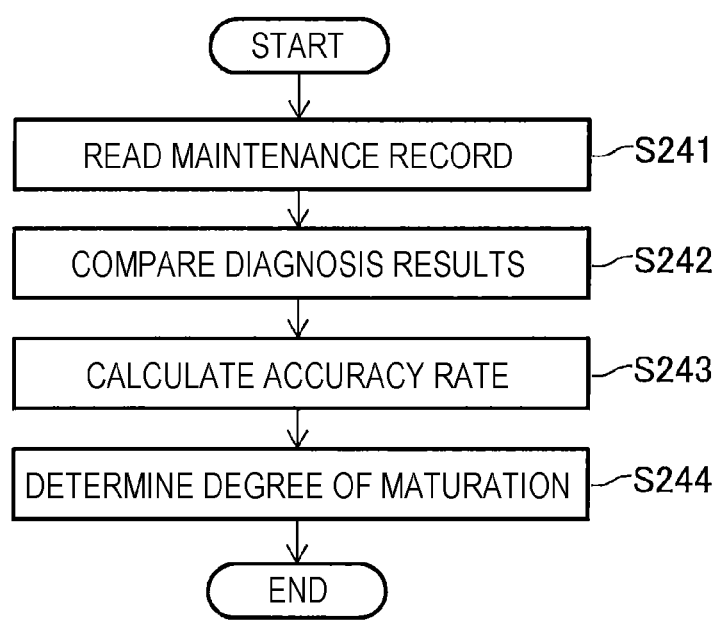
FIG. 12A is a flowchart of a degree of maturation determination processing procedure.

The degree of maturation determination process will be described with reference to FIG. 12A. As a premise to start the degree of maturation determination process, the auxiliary storage device 15 is assumed to store the diagnosis result information 33 (FIG. 9) in a state in which only the maintenance worker diagnosis result field 128 and model evaluation field 129 are empty fields. Then, the degree of maturation determination processing procedure is started at an arbitrary timing.

In step S241, the degree of maturation determining unit 26 of the device diagnostic apparatus 1 reads the maintenance record. The maintenance record is the diagnosis result obtained after the maintenance worker actually observes the device. The maintenance record stores "normal" or "abnormal" serving as the diagnosis result in association with the vehicle ID and the time point. Specifically, firstly, the degree of maturation determining unit 26 acquires one unprocessed record among the records of the diagnosis result information 33 (FIG. 9). Here, the acquired record obtained is hereinafter also referred to as an "evaluation record."

Secondly, the degree of maturation determining unit 26 acquires the corresponding diagnosis result with reference to the maintenance record using the vehicle ID and the time point of the evaluation record. Thirdly, the degree of maturation determining unit 26 stores the diagnosis result acquired in "secondly" in step S241 in the maintenance worker diagnosis result field 128 of the evaluation record.

In step S242, the degree of maturation determining unit 26 compares the diagnosis results. Specifically, firstly, the degree of maturation determining unit 26 compares the model diagnosis result of the evaluation record with the maintenance worker diagnosis result. Secondly, the degree of maturation determining unit 26 stores an evaluation flag "O" in the model evaluation field 129 of the evaluation record when the two diagnosis results coincide with each other as a result of comparison, and stores an evaluation flag "X" in the model evaluation field 129 of the evaluation record when the two diagnosis results do not coincide with each other as a result of comparison. The degree of maturation determining unit 26 repeats the process of steps S241 and S242 for each unprocessed evaluation record.

In step S243, the degree of maturation determining unit 26 calculates an accuracy rate. Specifically, the degree of maturation determining unit 26 calculates the following accuracy rate for each used diagnosis model ID. Accuracy rate=the number of records having the evaluation flag "O"/ the number of records having a certain used diagnosis model ID×100(%)

In step S244, the degree of maturation determining unit 26 determines the degree of maturation. The degree of maturation is an evaluation value defined for each diagnosis model in accordance with the accuracy rate of the diagnosis model, and the degree of maturation increases as the accuracy rate increases. Thereafter, the degree of maturation determination processing procedure ends.

(Degree of Maturation use Method)

There are cases in which the degree of maturation of the statistical model in a certain driving environment is smaller than a predetermined threshold value and smaller than the degree of maturation of the physical model in the driving environment. In this case, the diagnosis model selecting unit 24 may go through "No" in step S223. Further, in this case, the diagnosis model generating unit 23 may reduce the radius of the sphere of the statistical model having the small degree of maturation.

In the above example, when the cooling device is diagnosed, the statistical model has the coolant temperature, the coolant flow rate, and the fan rotation speed as the input variable. However, all or some of the input variables of the statistical model for diagnosing the same cooling device may be different variables (for example, the engine rotation speed, the coolant concentration, and the like). Then, a plurality of statistical models can be used for a single driving environment. Further, in step S224, the diagnosis model selecting unit 24 may store a statistical model ID specifying the largest degree of maturation among a plurality of statistical models for the same driving environment in the recommended model ID field 115 of the target record.

Further, the diagnosis model selecting unit 24 may store a plurality of statistical model IDs specifying a plurality of statistical models whose degree of maturation is larger than a predetermined threshold value among the statistical models for the same driving environment in the recommended model ID unit 115 of the target record. In this case, the diagnosis unit 25 decides the diagnosis result for certain operation data for every two or more statistical models. The diagnosis unit 25 may obtain the diagnosis result on the basis of a logical product of a plurality of diagnosis results. In other words, it is diagnosed as being "normal" when all the diagnosis results are "normal," it is diagnosed as being "abnormal" when all the diagnosis results are "abnormal," and it is diagnosed as being "non-diagnosable" otherwise.

(Terminal Center Collaboration Processing Procedure)

The terminal center collaboration processing procedure will be described with reference to FIG. 12B. In the above example, the device diagnostic apparatus 1 diagnoses the operation data. However, the terminal device 2 installed in the vehicle 5 may undertake the device diagnostic apparatus 1. Furthermore, for the same operation data which is the diagnosis target, the terminal device 2 may perform rough diagnosis, and the device diagnostic apparatus 1 may perform detailed diagnosis. The terminal center collaboration processing procedure is an example in which role sharing is performed between the terminal device 2 and the device diagnostic apparatus 1. The terminal device 2 includes the components of the device diagnostic apparatus 1 of FIG. 6 and performs communication with the device diagnostic apparatus 1 via the network 6. The components of the terminal device 2 are distinguished from the components of the device diagnostic apparatus 1 having the equivalent function by attaching "b" to the end of the number. The device diagnostic apparatus 1 and the terminal device 2 constitute the device diagnostic system.

Figure 12B:
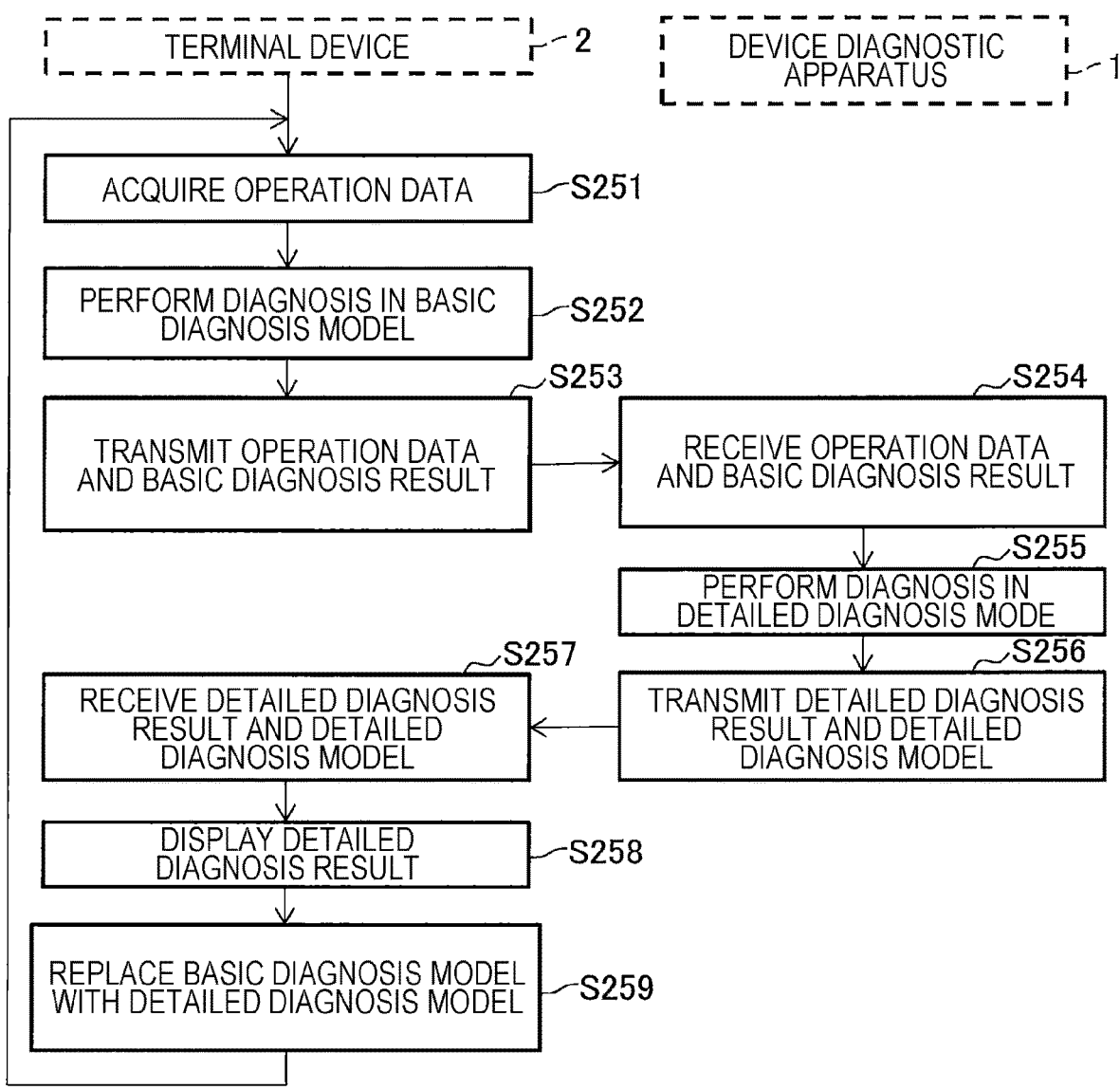
FIG. 12B is a flowchart of a terminal center collaboration processing procedure.

In FIG. 12B, both the detailed diagnosis model used by the device diagnostic apparatus 1 and the basic diagnosis model used by the terminal device 2 are the statistical models of diagnosing the same type of device in the same driving environment. However, the detailed diagnosis model differs from the basic diagnosis model in the following points. The detailed diagnosis model is generated using newer and more abundant operation data (learning data). The terminal device 2 is able to learn the basic diagnosis model in accordance with the operation data acquired by the vehicle. The device diagnostic apparatus 1 is able to learn the detailed diagnosis model in accordance with the operation data acquired by a plurality of vehicles including the vehicle.

The detailed diagnosis model has a finer grain size for the device of the diagnosis target. For example, the basic diagnosis model used by the terminal device 2 diagnoses the whole braking system, while the detailed diagnosis model used by the device diagnostic apparatus 1 diagnoses parts included in the braking system (a brake cylinder, a brake pad, a brake disc, and the like). In other words, after the terminal device 2 first reports a warning indicating that "the braking system is abnormal," and then the device diagnostic apparatus 1 reports a more detailed warning indicating that "the brake cylinder is abnormal."

In step S251, the operation data acquiring unit 21*b* of the terminal device 2 acquires the operation data. In step S252, the diagnosis unit 25*b* of the terminal device 2 diagnoses the operation data acquired in step S251 with the basic diagnosis model. In step S253, the diagnosis unit 25*b* of the terminal device 2 transmits the diagnosis result (basic diagnosis result) based on the operation data acquired in step S251 and the basic diagnosis model to the device diagnostic apparatus 1. Further, for example, the basic diagnosis result is either "the braking system is normal" or "the braking system is abnormal."

In step S254, the diagnosis unit 25 of the device diagnostic apparatus 1 receives the operation data acquired in step S251 and the basic diagnosis result from the terminal device 2. In step S255, the diagnosis unit 25 of the device diagnostic apparatus 1 performs the diagnosis on the operation data acquired in step S251 with the detailed diagnosis model. In step S256, the diagnosis unit 25 of the device diagnostic apparatus 1 transmits the diagnosis result (detailed diagnosis result) according to the detailed diagnosis model and the detailed diagnosis model to the terminal device 2. Further, the detailed diagnosis result is, for example, "○○ of the braking system is normal" or "⊙⊙ of braking system is abnormal."

In step S257, the diagnosis unit 25b of the terminal device 2 receives the detailed diagnosis result and the detailed diagnosis model from the device diagnostic apparatus 1. In step S258, the diagnosis unit 25b of the terminal device 2 displays the detailed diagnosis result. Specifically, the diagnosis unit 25b causes the detailed diagnosis result to be displayed on the output device 13b together with the basic diagnosis result. In step S259, the diagnosis unit 25b of the terminal device 2 replaces the basic diagnosis model with the detailed diagnosis model. Specifically, the diagnosis unit 25b replaces the basic diagnosis model used in step S252 with the detailed diagnosis model received in step S257, and then returns to step S251.

Further, "start" and "end" are omitted in FIG. 12B. This means that a power switch of the terminal device 2 is turned on, and this process is repeated each time the terminal device 2 acquires the operation data.

(Display Screen)

Figure 13A:
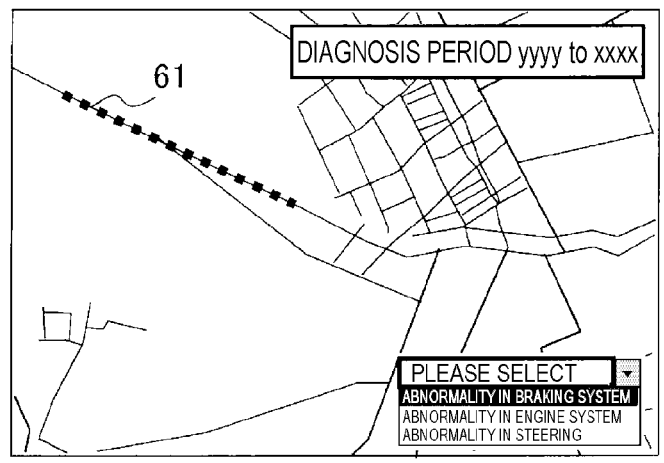
FIGS. 13A, 13B, and 13C are examples of a display screen.

An example of a display screen will be described with reference to FIG. 13. FIG. 13A illustrates an example of a screen which the diagnosis unit 25 of the device diagnostic apparatus 1 or the diagnosis unit 25b of the terminal device 2 displays on the output device 13 (13b). If the user receives the device of the diagnosis target selected from the device selection field by the user, the diagnosis unit 25 (25b) causes the model diagnosis result of the diagnosis result information 33 (FIG. 9) to be displayed superimposed on the map information 35. "■" displayed on a road 61 in FIG. 13A indicates that "the braking system is abnormal." Fourteen "■" are displayed consecutively. Thus, it is understood that the effect of the braking system (brake) has been deteriorated continuously in the diagnosis period yyyy to xxxx.

Figure 13B:
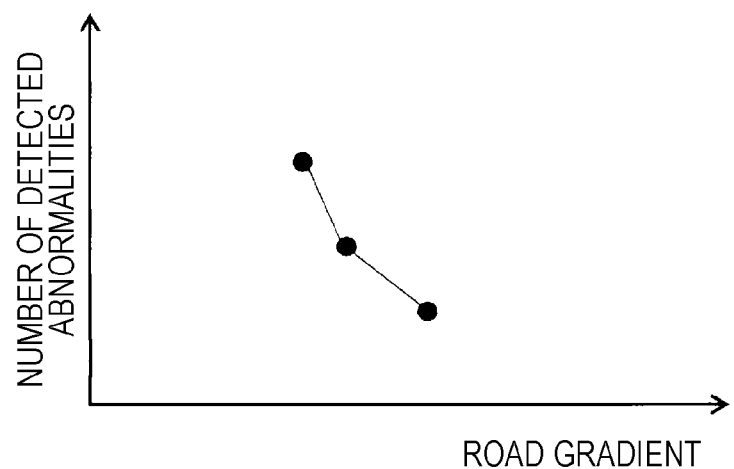
Figure 13C:
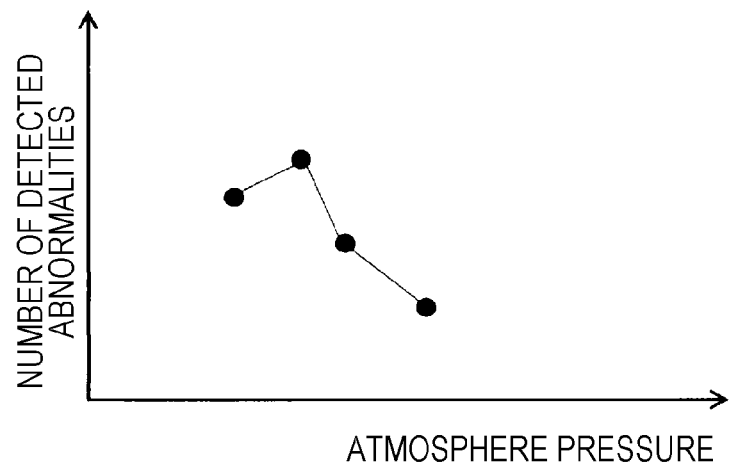

Further, if the diagnosis unit 25 (25b) receives any one of "■" pushed by the user with a finger, a graph of FIG. 13B and a graph of FIG. 13C are displayed on the output device 13 (13b). A horizontal axis in FIG. 13B indicates a road gradient, and a vertical axis indicates the number of detected abnormalities (the number of "■" in FIG. 13A) in the diagnosis period. It can be understood from FIG. 13B that the number of detected abnormalities increases as the road gradient decreases (as it is a harsher downhill). A horizontal axis in FIG. 13C indicates atmospheric pressure, and a vertical axis indicates the number of detected abnormalities in the diagnosis period. It can be understood from FIG. 13C that the number of detected abnormalities decreases as the atmospheric pressure increases (as it goes downhill). The user (the driver of the vehicle 5) knows that it is necessary to avoid the consumption of the braking system (the brake pad or the like) on the downhill road until the maintenance of the vehicle 5 is carried out.

(Effects of Present Embodiment)

The effect of the device diagnostic apparatus of the present embodiment is as follows. (1) The device diagnostic apparatus can change the diagnosis model as the driving environment of the moving device changes. (2) In the device diagnostic apparatus, the statistical model and the physical model can be used together. (3) Since the device diagnostic apparatus preferentially selects the statistical model, the human experience can be effectively utilized. (4) The device diagnostic apparatus can improve the degree of maturation while accumulating the learning results. (5) The device diagnostic apparatus can review the reliability (the degree of maturation) of the diagnosis model through human judgment.

(6) The device diagnostic apparatus can acquire the driving environment of the device if the position of the moving device is known. (7) The device diagnostic apparatus can more carefully diagnose the device on the basis of the diagnosis results of a plurality of diagnosis models. (8) The device diagnostic apparatus can use the weather or the road attribute which is easily obtainable as the driving environment. (9) Since the device diagnostic apparatus generates the statistical model in association with the combination of the ranges of the driving environments, the accurate diagnosis can be performed even when there is a detailed change in an individual driving environment.

The present invention is not limited to the above embodiments but includes various modified examples. For example, the above embodiments have been described in detail in order to help with understanding with the present invention and are not necessarily limited to a configuration including all the described components. Further, it is possible to replace some components of one embodiment with components of another embodiment, and it is possible to add components of another embodiment to components of one embodiment. Further, it is possible to perform addition, deletion, and replacement of components on some components of each embodiment.

Furthermore, some or all of components, functions, processing units, processing devices, or the like described above may be implemented by hardware, for example, may be designed by an integrated circuit. Moreover, components, functions, or the like described above may be implemented by software by interpreting and executing a program for implementing the functions through a processor. Information such as programs, tables, or files for implementing functions may be stored in a recording device such as a memory, a hard disk, or a solid state drive (SSD) or a recording medium such as an IC card, an SD card, or a DVD. Further, control lines or information lines considered to be necessary for the sake of description are illustrated, and all control lines or information lines necessary in a product are not necessarily illustrated. Practically, most of components may be considered to be connected to one another.

What is claimed is:

1. A device diagnostic apparatus, comprising:
a first sensor that detects a driving environment;
a second sensor that detects operation data of a device, wherein the device is a system of a vehicle;
a memory; and
a processor communicatively coupled to each of the memory, the first sensor, and the second sensor, the processor configured to:
select a diagnosis model for diagnosing a moving device, the diagnosis model corresponding to the detected driving environment, and
input the operation data of the device to the selected diagnosis model,
receive an output of a diagnosis result for the device from the diagnosis model, and
diagnose the device, wherein the diagnosis model is a statistical model that when executed by the processor:
  acquires learning data of the operation data when the device is operating in a predetermined driving environment identified as normal condition,
  forms a virtual multi-dimensional (multi-D) coordinate space based on three parameters of the operation data,
  plots the learning data in the virtual multi-D coordinate space,
  defines, in the virtual multi-D coordinate space, a coordinate value and a radius of a sphere that envelops the learning data corresponding to the predetermined driving environment; and
  when the detected driving environment matches the predetermined driving environment, plots the detected operation data in the virtual multi-D coordinate space and compares the radius of the sphere to a distance from the plotted detected operation data to a center of the sphere.

2. The device diagnostic apparatus according to claim 1, wherein the diagnosis model includes a physical model derived from a design condition of the device or a natural law.

3. The device diagnostic apparatus according to claim 2, wherein the processor is configured to preferentially select the statistical model over and physical model.

4. The device diagnostic apparatus according to claim 1, wherein the processor is configured to compare the diagnosis result obtained by the diagnosis model for the device with a diagnosis result obtained by a human for the device and calculate a degree of maturation of the diagnosis model.

5. The device diagnostic apparatus according to claim 4, wherein the processor is configured to acquire the driving environment of the device from map information or an external server on a basis of position information of the device.

6. The device diagnostic apparatus according to claim 5, wherein the diagnosis by the processor is on a basis of a logical product of diagnosis results obtained by a plurality of diagnosis models.

7. The device diagnostic apparatus according to claim 6, wherein the driving environment includes a weather or a road attribute,
the weather includes at least one of a temperature, humidity, atmospheric pressure, a wind direction, a wind speed, and a precipitation amount, and
the road attribute includes at least one of a gradient, an altitude, a traffic volume, a number of intersections, a number of lanes, a width, a road surface state, and a road shape.

8. The device diagnostic apparatus according to claim 7, wherein the processor is configured to generate the statistical model in association with a combination of ranges of a plurality of the driving environments.

9. The device diagnostic apparatus according to claim 1, wherein the device is a cooling system, a braking system, or an engine system.

10. The device diagnostic apparatus according to claim 1, wherein the device is a cooling system, and
wherein the operation data includes each of a fan rotation speed, a coolant temperature, and a coolant flow rate.

11. A device diagnostic method for a device diagnostic apparatus, the device diagnostic method comprising:
  detecting a driving environment of a device;
  detecting operation data of the device, wherein the device is a system of a vehicle;
  select a diagnosis model for diagnosing a moving device, the diagnosis model corresponding to the detected driving environment; and
  inputting the operation data of the device to the selected diagnosis model, receiving an output of a diagnosis result for the device from the selected diagnosis model, and diagnosing the device;
  wherein the diagnosis model is a statistical model that when executed by the processor:
    acquires learning data of the operation data when the device is operating in a predetermined driving environment identified as normal condition,
    forms a virtual multi-dimensional (multi-D) coordinate space based on three parameters of the operation data,
    plots the learning data in the virtual multi-D coordinate space,
    defines, in the virtual multi-D coordinate space, a coordinate value and a radius of a sphere that envelops the learning data corresponding to the predetermined driving environment; and
    when the detected driving environment matches the predetermined driving environment, plots the detected operation data in the virtual multi-D coordinate space and compares the radius of the sphere to a distance from the plotted detected operation data to a center of the sphere.

12. The device diagnostic method for a device diagnostic apparatus according to claim 11,
wherein the diagnosis model includes a physical model derived from a design condition of the device or a natural law.

* * * * *